(12) United States Patent
Kim et al.

(10) Patent No.: US 11,594,814 B2
(45) Date of Patent: Feb. 28, 2023

(54) ANTENNA APPARATUS AND ANTENNA MODULE

(71) Applicant: Samsung Electro-Mechanics Co., Ltd., Suwon-si (KR)

(72) Inventors: Nam Ki Kim, Suwon-si (KR); Jeong Ki Ryoo, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 148 days.

(21) Appl. No.: 17/193,250

(22) Filed: Mar. 5, 2021

(65) Prior Publication Data

US 2021/0194121 A1 Jun. 24, 2021

Related U.S. Application Data

(63) Continuation of application No. 16/165,001, filed on Oct. 19, 2018, now Pat. No. 10,978,796.

(30) Foreign Application Priority Data

Dec. 28, 2017 (KR) .................. 10-2017-0183036
Jun. 4, 2018 (KR) .................. 10-2018-0064245

(51) Int. Cl.
*H01Q 1/48* (2006.01)
*H01Q 9/16* (2006.01)
(Continued)

(52) U.S. Cl.
CPC ......... *H01Q 1/48* (2013.01); *H01L 23/49822* (2013.01); *H01L 23/552* (2013.01);
(Continued)

(58) Field of Classification Search
CPC ...... H01Q 19/104; H01Q 1/526; H01Q 25/00; H01Q 21/08; H01Q 21/065; H01Q 19/24;
(Continued)

(56) References Cited

U.S. PATENT DOCUMENTS 9,172,135 B2   10/2015   Sudo et al.
9,570,809 B2   2/2017    Ganchrow et al.
(Continued)

FOREIGN PATENT DOCUMENTS

CN   101064379 A   10/2007
CN   101075702 A   11/2007
(Continued)

OTHER PUBLICATIONS

Chinese Office Action dated Apr. 2, 2020 issued in the related Chinese Patent Application No. 201811453588.0 (24 pages in English and 16 pages in Chinese).
(Continued)

*Primary Examiner* — Graham P Smith
(74) *Attorney, Agent, or Firm* — NSIP Law

(57) ABSTRACT

An antenna apparatus includes: a feed line; a first ground layer including surface disposed above or below the feed line and spaced apart from the feed line; and an antenna pattern electrically connected to an end of the feed line and configured to transmit and/or receive a radio frequency (RF) signal, wherein the first ground layer includes a first protruding region protruding in a first longitudinal direction of the surface toward the antenna pattern and at least partially overlapping the feed line above or below the feed line, and second and third protruding regions protruding in the first longitudinal direction from positions spaced apart from the first protruding region in opposite lateral directions of the surface.

16 Claims, 19 Drawing Sheets

(51) Int. Cl.
- *H01Q 1/22* (2006.01)
- *H01Q 21/06* (2006.01)
- *H01L 23/498* (2006.01)
- *H01L 23/552* (2006.01)
- *H01L 23/66* (2006.01)
- *H01Q 9/04* (2006.01)
- *H01Q 21/08* (2006.01)
- *H01Q 1/52* (2006.01)
- *H01Q 19/24* (2006.01)
- *H01Q 9/26* (2006.01)
- *H01Q 25/00* (2006.01)
- *H01Q 19/10* (2006.01)

(52) U.S. Cl.
CPC .......... *H01L 23/66* (2013.01); *H01Q 1/2283* (2013.01); *H01Q 1/523* (2013.01); *H01Q 9/045* (2013.01); *H01Q 9/0414* (2013.01); *H01Q 9/16* (2013.01); *H01Q 9/26* (2013.01); *H01Q 19/24* (2013.01); *H01Q 21/065* (2013.01); *H01Q 21/08* (2013.01); *H01Q 25/00* (2013.01); *H01L 2223/6677* (2013.01); *H01L 2224/131* (2013.01); *H01L 2224/16227* (2013.01); *H01L 2224/32225* (2013.01); *H01L 2224/73204* (2013.01); *H01L 2924/1532* (2013.01); *H01L 2924/15192* (2013.01); *H01L 2924/15321* (2013.01); *H01L 2924/16251* (2013.01); *H01L 2924/19105* (2013.01); *H01L 2924/3025* (2013.01); *H01Q 1/526* (2013.01); *H01Q 19/104* (2013.01)

(58) Field of Classification Search
CPC .......... H01Q 9/26; H01Q 9/16; H01Q 9/045; H01Q 9/0414; H01Q 1/523; H01Q 1/2283; H01Q 1/48
See application file for complete search history.

(56) References Cited

U.S. PATENT DOCUMENTS

| | | | | |
|---|---|---|---|---|
| 2010/0302115 | A1* | 12/2010 | Chen | H01Q 21/062 343/727 |
| 2011/0285474 | A1 | 11/2011 | Ali | |
| 2012/0229343 | A1 | 9/2012 | Sudo et al. | |
| 2013/0027268 | A1 | 1/2013 | Ohno et al. | |
| 2015/0002363 | A1 | 1/2015 | Wong et al. | |
| 2016/0294052 | A1 | 10/2016 | Baek et al. | |
| 2017/0214119 | A1 | 7/2017 | Aoki | |
| 2017/0309991 | A1 | 10/2017 | Noori et al. | |
| 2018/0316097 | A1* | 11/2018 | Wium | H01Q 1/48 |
| 2019/0173176 | A1 | 6/2019 | Kim et al. | |

FOREIGN PATENT DOCUMENTS

| | | |
|---|---|---|
| CN | 101443957 A | 5/2009 |
| CN | 102683835 A | 9/2012 |
| CN | 102906936 A | 1/2013 |
| CN | 103563166 A | 2/2014 |
| CN | 106992357 A | 7/2017 |
| JP | 2001-313516 A | 11/2001 |
| JP | 2012-120191 A | 6/2012 |
| JP | 2012-191317 A | 10/2012 |
| JP | WO2012/164782 A1 | 7/2014 |
| JP | 2017-130832 A | 7/2017 |
| JP | 3211380 U | 7/2017 |
| KR | 10-2015-0033187 A | 4/2015 |
| KR | 10-2015-0130046 A | 11/2015 |
| KR | 10-2019-0065112 A | 6/2019 |
| WO | WO 2007/126897 A2 | 11/2007 |
| WO | WO 2011/149941 A1 | 12/2011 |
| WO | WO 2012/129426 A2 | 9/2012 |

OTHER PUBLICATIONS

Chinese Office Action dated Mar. 16, 2020 in corresponding Chinese Patent Application No. 201811452713.6 (24 pages in English, 17 pages in Chinese).

Japanese Office Action dated Aug. 13, 2019 in counterpart Japanese Patent Application No. 2018-198832 (3 pages in English and 2 pages in Japanese).

Korean Office Action dated Feb. 21, 2019 in corresponding Korean Patent Application No. 10-2018-0064245 (4 pages in English and 4 pages in Korean).

Korean Notice of Allowance dated Jul. 31, 2021, issued in counterpart Korean Patent Application No. 10-2019-0128179 (2 pages in English and 2 pages in Korean).

* cited by examiner

ANTENNA APPARATUS AND ANTENNA MODULE

CROSS-REFERENCE TO RELATED APPLICATIONS

This application is a continuation of application Ser. No. 16/165,001 filed on Oct. 19, 2018, which claims the benefit under 35 U.S.C. § 119(a) of Korean Patent Application Nos. 10-2017-0183036 and 10-2018-0064245 filed on Dec. 28, 2017 and Jun. 4, 2018, respectively, in the Korean Intellectual Property Office, the entire disclosures of which are incorporated herein by reference for all purposes.

BACKGROUND

1. Field

The following description relates to an antenna apparatus and an antenna module.

2. Description of Related Art

Mobile communications data traffic tends to increase rapidly every year. Technological development is being pursued to support rapidly increasing data in wireless networks in real time. For example, applications such as generating content from Internet of thing (IoT)-based data, augmented reality (AR), virtual reality (VR), live VR/AR combined with social network services (SNS), autonomous driving, sync view (real-time image transmission of a user's view using compact camera), and the like, require communications (e.g., 5th-generation (5G) communications, millimeter wave (mmWave) communications, etc.) supporting the exchange of mass data.

Therefore, mmWave communications including 5G communications have been studied and researched with regard to the commercialization/standardization of antenna modules capable of smoothly implementing mmWave communications.

RF signals in high frequency bands (e.g., 24 GHz, 28 GHz, 36 GHz, 39 GHz, 60 GHz, etc.) are easily absorbed in the course of transmissions and lead to loss, so that quality of communications may be drastically lowered. Therefore, antennas for communications of high-frequency bands may demand a technical approach different from that of the related art antenna technology, and the development of special technologies such as a separate power amplifier for securing an antenna gain, integrating an antenna and a radio frequency integrated circuit (RFIC), and ensuring effective isotropic radiated power, for example, may be beneficial.

Traditionally, antenna modules providing a mmWave communications environment include a structure in which an integrated circuit (IC) and an antenna are disposed on a board and are connected by a coaxial cable to meet a high level (e.g., transmit/receive ratio, gain, directivity, etc.) of antenna performance according to high frequencies. This structure, however, may lead to insufficient antenna layout space, limitations on the degree of freedom of an antenna shape, increased interference between the antenna and the IC, and an increase in the size and/or cost of antenna modules.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna apparatus includes: a feed line; a first ground layer including surface disposed above or below the feed line and spaced apart from the feed line; and an antenna pattern electrically connected to an end of the feed line and configured to transmit and/or receive a radio frequency (RF) signal, wherein the first ground layer includes a first protruding region protruding in a first longitudinal direction of the surface toward the antenna pattern and at least partially overlapping the feed line above or below the feed line, and second and third protruding regions protruding in the first longitudinal direction from positions spaced apart from the first protruding region in opposite lateral directions of the surface.

The antenna apparatus may further include: a second ground layer disposed above or below the first ground layer and spaced apart from the ground layer, wherein the second ground layer includes a fourth protruding region protruding in the first longitudinal direction toward the antenna pattern to at least partially overlap the feed line above or below the feed line, the second ground layer overlaps a first recessed region recessed in a second longitudinal direction opposite the first longitudinal direction and disposed between the first and second protruding regions of the first ground layer, and the second ground layer overlaps a second recessed region recessed in the second longitudinal direction and disposed between the first and third protruding regions of the first ground layer.

The antenna apparatus may further include: a feeding via disposed to electrically connect the antenna pattern and the feed line, wherein the antenna pattern is spaced apart from the second ground layer by the feeding via.

The antenna apparatus may further include: a wiring electrically connected to the feed line; and a third ground layer disposed above or below the first ground layer, spaced apart from the first ground layer, and surrounding the wiring, wherein the third ground layer includes a third recessed region recessed in the second horizontal direction and disposed between the second and third protruding regions of the first ground layer.

The antenna apparatus may further include: a wiring via electrically connected to the wiring; and a fourth ground layer disposed above or below the first ground layer, spaced apart from the first ground layer, and having a through hole through which the wiring via passes, wherein the fourth ground layer includes a fourth recessed region recessed in the second horizontal direction and disposed between the second and third protruding regions of the first ground layer.

The first protruding region of the first ground layer may protrude farther in the first horizontal direction than the second and third protruding regions of the first ground layer.

A distance between the antenna pattern and the first protruding region of the first ground layer in the first horizontal direction may be shorter than a protruding length of the second or third protruding region of the first ground layer in the first horizontal direction.

The antenna pattern may have a form of a dipole. A length of a first pole of the dipole may be greater than a distance between the first protruding region and the second protruding region of the first ground layer. A length of a second pole of the dipole may be longer than a distance between the first protruding region and the third protruding region of the first ground layer.

The antenna apparatus may further include: a director pattern spaced apart from the antenna pattern, wherein a length of the director pattern in a lateral direction among the opposite lateral directions is less than a distance between the second protruding region and the third protruding region of the first ground layer and greater than a length of the first protruding region of the ground layer in the lateral direction.

The antenna apparatus may further include: shielding vias electrically connected to the first ground layer and arranged along a boundary of a region between the second protruding region and the third protruding region of the first ground layer.

In another general aspect, an antenna module includes: a connection member including a first ground layer and a second ground layer including a surface disposed above or below the first ground layer; antenna patterns each spaced apart from the first and second ground layers and configured to transmit and/or receive a radio frequency (RF) signal; feed lines each electrically connected to a corresponding antenna pattern among the antenna patterns and extending from the corresponding antenna pattern toward the first ground layer in a first longitudinal direction of the surface; and protruding ground patterns electrically connected to the first ground layer and protruding from the first ground layer, in a second longitudinal direction of the surface opposite the first longitudinal direction, to at least partially overlap the feed lines above or below the feed lines, wherein the first ground layer is recessed in the first longitudinal direction at regions corresponding to each of the antenna patterns.

The antenna module may further include: feeding vias each disposed to electrically connect a corresponding antenna pattern among the antenna patterns and a corresponding feed line among the feed lines, wherein the protruding ground patterns are spaced apart from the feeding vias in a lateral direction of the surface.

The feed lines may be disposed between the protruding ground patterns and the second ground layer. Each of the protruding ground patterns may protrude in the second longitudinal direction with respect to a corresponding recessed region of the first ground layer. The second ground layer may protrude in the second longitudinal direction toward each of the antenna patterns.

The antenna module may further include: an integrated circuit (IC) disposed below the connection member, wherein the connection member includes wirings each electrically connected to a corresponding feed line among the feed lines, and a wiring vias each having an end electrically connected to a corresponding wiring among the wirings and the another end electrically connected to the IC.

The antenna module may further include: a passive component disposed below the connection member; and a shielding member disposed below the connection member and surrounding the IC, wherein the first and second ground layers are electrically connected to the passive component and the shielding member.

The antenna module may further include: patch antenna patterns disposed above the connection member; and second feeding vias each having an end electrically connected to a corresponding patch antenna pattern among the patch antenna patterns, wherein the connection member further includes second wirings each electrically connected to a corresponding second feeding via among the second feeding vias, and second wiring vias each having an end electrically connected to a corresponding second wiring among the second wirings and another end electrically connected to the IC.

In another general aspect, an antenna apparatus includes: a connection member including a first ground layer and a second ground layer spaced from the first ground layer in a vertical direction; an antenna pattern spaced from the first and second ground layers in a first longitudinal direction, and configured to transmit and/or receive a radio frequency (RF) signal; and a feed line electrically connected to the antenna pattern and extending from the antenna pattern toward the first ground layer, wherein the first ground layer includes a first recessed portion recessed from an end portion of the second ground layer in a second longitudinal direction opposite the first longitudinal direction, and aligned with a first pole of the antenna pattern, and a second recessed portion recessed from the end portion of the second ground layer in the second longitudinal direction, spaced from the first recessed portion in a lateral direction, and aligned with a second pole of the antenna pattern.

The antenna apparatus may further include: a first cavity formed by the second ground layer and the first recessed portion; and a second cavity formed by the second ground layer and the second recessed portion.

The first ground layer may further include a first middle protruding portion and side-end protruding portions, wherein the first middle protruding portion and the side-end protruding portions protrude at an end portion of the first ground layer in the first horizontal direction and form boundaries of the first and second cavities.

The second ground layer may include a second middle protruding portion protruding at an end portion of the second ground layer in the first horizontal direction. The feed line may be disposed between the first middle protruding portion and the second middle protruding portion in the vertical direction. The first middle protruding portion and the second middle protruding portion may at least partially overlap the feed line in the first longitudinal direction.

In another general aspect, an antenna apparatus includes: a first ground layer including a first recess and a second recess laterally spaced from the first recess; a second ground layer including a longitudinally and laterally extending surface disposed on the first ground layer and a side at an edge of the surface, wherein portions of the surface are exposed by the first and second recesses; a feed line extending longitudinally away from the first and second ground layers, beyond the side; and an antenna pattern electrically connected to the feed line and configured to transmit and/or receive a radio frequency (RF) signal, wherein the antenna pattern is longitudinally spaced apart from the first and second ground layers beyond the side such that the antenna pattern opposes the first and second recesses.

The antenna apparatus may further include: a feeding via disposed to electrically connect the antenna pattern and the feed line, wherein the antenna pattern is spaced away from the surface in a direction perpendicular to the surface by the feeding via.

The antenna apparatus may further include a third ground layer disposed on the first ground layer, wherein the third ground layer includes a third recess exposing the portions of the surface.

The surface and the first recessed portion may define a first cavity. The surface and the second recessed portion may define a second cavity.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
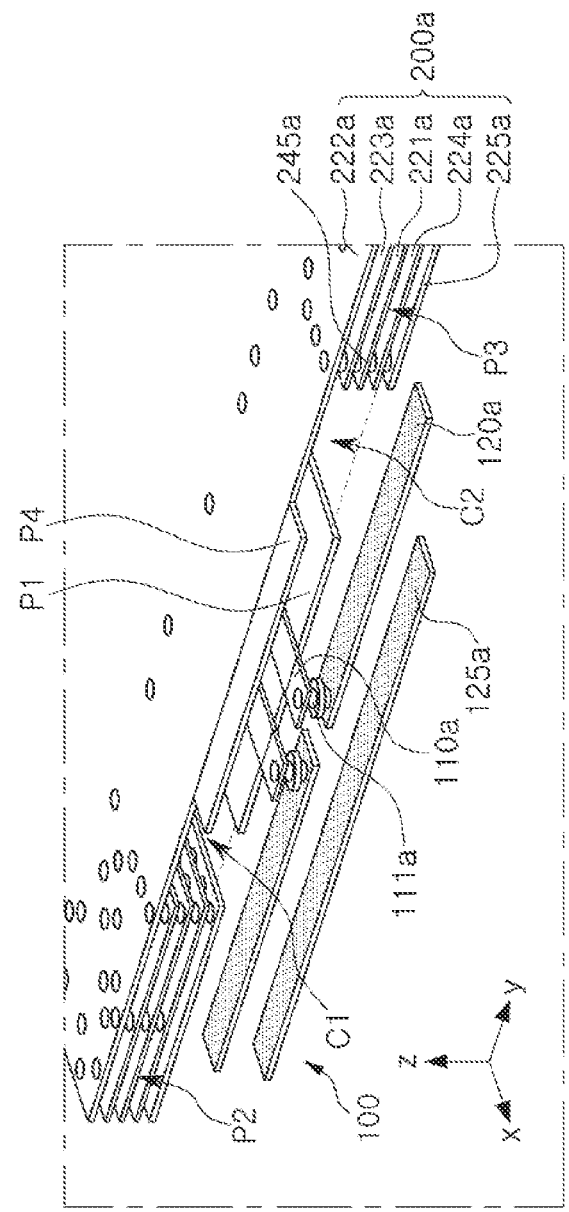
FIG. 1 is a perspective view illustrating an antenna apparatus, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
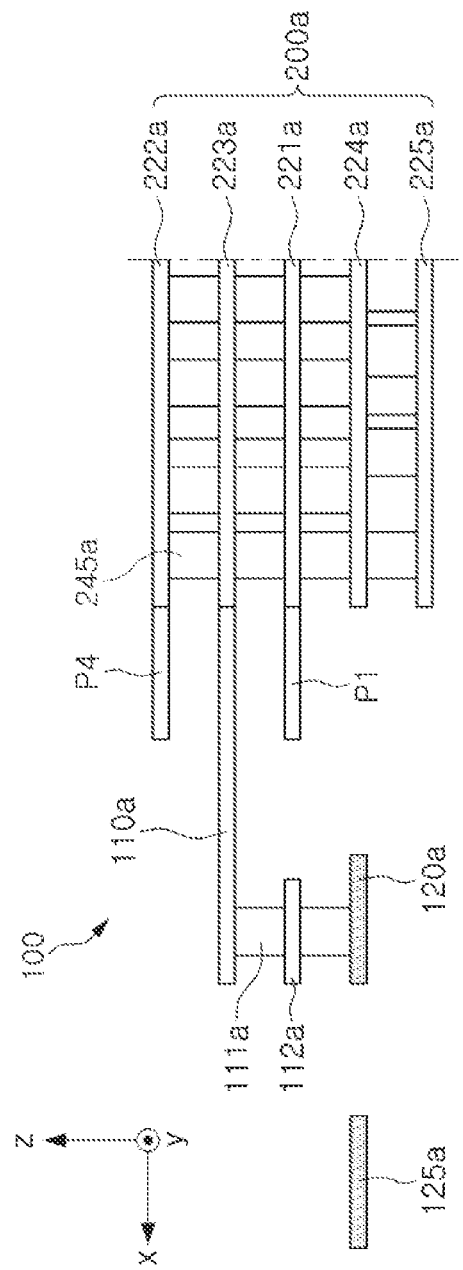
FIG. 2 is a side view illustrating the antenna apparatus illustrated in FIG. 1.

FIG. 1 is a perspective view illustrating an antenna apparatus 100, according to an embodiment. FIG. 2 is a side view illustrating the antenna apparatus 100.

Referring to FIGS. 1 and 2, an antenna apparatus 100 may include an antenna pattern 120a and a connection member 200a. The antenna pattern 120a may receive a radio frequency (RF) signal from the connection member 200a via a feed line 110a and remotely transmit the RF signal in the x direction, or the antenna pattern 120a may remotely receive an RF signal in the x direction and transfer the received RF signal to the connection member 200a via the feed line 110a. For example, the antenna pattern 120a may have a dipole shape, and thus, the antenna pattern 120 may have a structure extending in the yz plane.

Referring to FIGS. 1 and 2, the connection member 200a may include at least a portion of a first ground layer 221a, a second ground layer 222a, a third ground layer 223a, a fourth ground layer 224a, and a fifth ground layer 225a and may further include an insulating layer disposed between adjacent ground layers among the first to fifth ground layers 221a, 222a, 223, 224a, and 225a. The first to fifth ground layers 221a, 222a, 223a, 224a, and 225a may be spaced apart from each other in a vertical direction (z direction).

The antenna apparatus 100 may include at least one of first to fifth ground layers 221a, 222a, 223a, 224a, and 225a. The number and a vertical relationship of the first to fifth ground layers 221a, 222a, 223a, 224a, and 225a may vary depending on the design of the antenna apparatus 100.

For example, the first to fifth ground layers 221a, 222a, 223a, 224a, and 225a may each include surfaces extending in the x and y directions (e.g., in the xy plane). Thus, each of the first to fifth ground layers 221a, 222a, 223a, 224a, and 225a may be disposed (indirectly) on a surface of an adjacent ground layer among the first to fifth ground layers 221a, 222a, 223a, 224a, and 225a.

The fourth and fifth ground layers 224a and 225a may provide a ground used in circuitry and/or a passive component of an integrated circuit (IC) as an IC and/or a passive component. In addition, the fourth and fifth ground layers 224a and 225a may provide a transfer path of power and a signal used in the IC and/or passive component. Thus, the fourth and fifth ground layers 224a and 225a may be electrically connected to the IC and/or passive component.

The fourth and fifth ground layers 224a and 225a may be omitted depending on ground requirements of the IC and/or passive component. The fourth and fifth ground layers 224a and 225a may have a through hole through which a wiring via passes.

The third ground layer 223a may be disposed above the fourth and fifth ground layers 224a and 225a, spaced apart therefrom, and may surround a wiring, through which an RF signal flows, at the same height as that of the wiring. The wiring may be electrically connected to the IC via the wiring via.

The first and second ground layers 221a and 222a may be disposed above the fourth and fifth ground layers 224a and 225a, spaced apart therefrom, and may be disposed above and below the third ground layer 223a, respectively. The first ground layer 221a may improve electromagnetic isolation between the wiring and the IC and provide ground to the IC and/or passive component. The second ground layer 222a may enhance electromagnetic isolation between the wiring and a patch antenna pattern, provide a boundary condition for the patch antenna pattern, and reflect an RF signal transmitted/received by the patch antenna pattern to further concentrate a transmission/reception direction of the patch antenna pattern.

The second ground layer 222a may protrude farther than the first, third, fourth, and fifth ground layers 221a, 223a, 224a, and 225a. For example, the second ground layer 222a may protrude farther than the first, third, fourth, and fifth ground layers 221a, 223a, 224a, and 225a in the x direction. Accordingly, the second ground layer 222a may electromagnetically shield between the patch antenna pattern and the antenna pattern 120a, and accordingly, electromagnetic isolation between the patch antenna pattern and the antenna pattern 120a may be improved.

The boundaries of the first, third, fourth, and fifth ground layers 221a, 223a, 224a, and 225a may overlap one another when viewed in the vertical direction (z direction). That is, the boundaries of the first, third, fourth, and fifth ground layers 221a, 223a, 224a may overlap one another in the x and y directions. The boundaries may act as a reflector for the antenna pattern 120a, and thus, an effective distance between the first, third, fourth and fifth ground layers 221a, 223a, 224a, and 225a and the antenna pattern 120a may affect antenna performance of the antenna pattern 120a.

For example, if the effective distance were to be shorter than a reference distance, a gain of the antenna pattern 120a may deteriorate according to dispersion of the RF signal transmitted through the antenna pattern 120a and a resonance frequency of the antenna pattern 120a may be difficult to optimize due to an increase in capacitance between the first, third, fourth, and fifth ground layers 221a, 223a, 224a, and 225a and the antenna pattern 120a.

Also, if the antenna pattern 120a were to be disposed far away from the first, third, fourth, and fifth ground layers 221a, 223a, 224a, and 225a, the sizes of the antenna apparatus 100 and an antenna module including the antenna apparatus 100 may be increased.

In addition, if the connection member 200a were to be small, a transfer path of power and a signal and a disposition space of wirings may be insufficient, ground stability of the ground layers 221a, 223a, 224a, and 225a may deteriorate, and a disposition space of the patch antenna pattern may be insufficient. That is, performance of the antenna apparatus and the antenna module may deteriorate.

The antenna apparatus 100 and the antenna module may have a structure in which the effective distance between the first, third, fourth, and fifth ground layers 221a, 223a, 224a, and 225a and the antenna pattern 120 is provided, while the antenna pattern 120a is disposed close to the first, third, fourth, and fifth ground layers 221a, 223a, 224a, and 225a. Accordingly, the antenna apparatus 100 and the antenna module may have a reduced size and/or improved performance.

Referring to FIGS. 1 and 2, at least one of the first, third, fourth, and fifth ground layers 221a, 223a, 224a, and 225a included in the connection member 200a may have a first protrusion region P1 protruding toward the antenna pattern 120a in the x direction to overlap at least a portion of the feed line 110a when viewed in the vertical direction (z direction) and second and third protrusion regions P2 and P3 protruding in the x direction from positions spaced apart from the first protrusion region P1 in first and second lateral directions (e.g., the y direction and a direction opposite to the y direction), respectively. The first protrusion region P1 may overlap least a portion of the feed line 110a in the x and y directions.

Due to the first to third protrusion regions P1, P2, and P3, a boundary facing the antenna pattern 120a in at least one of the first, third, fourth, and fifth ground layers 221a, 223a, 224a, and 225a may have a concavo-convex structure. That is, a first cavity C1 may be formed between the first protruding region P1 and the second protruding region P2, and a second cavity C2 may be formed between the first protruding region P1 and the third protruding region P3. The first and second cavities C1 and C2 may provide a boundary condition advantageous for ensuring antenna performance of the antenna pattern 120a.

Since the boundary of at least one of the first, third, fourth and fifth ground layers 221a, 223a, 224a and 225a facing the antenna pattern 120a may act as a reflector for the antenna pattern 120a, a portion of an RF signal transmitting through the antenna pattern 120a may be reflected from the boundary of at least one of the first, third, fourth, and fifth ground layers 221a, 223a, 224a, and 225a.

The first and second cavities C1 and C2 may be recessed in a direction toward at least one of the first, third, fourth, and fifth ground layers 221a, 223a, 224a, and 225a, respectively (e.g., in a direction opposite the x direction), between one end and the other end of first and second poles of the antenna pattern 120a. That is, the first and second cavities C1 and C2 may act as reflectors for the first and second poles of the antenna pattern 120a, respectively.

Accordingly, an effective distance from each pole of the antenna pattern 120a to at least one of the first, third, fourth, and fifth ground layers 221a, 223a, 224a, and 225a may be increased in comparison to an antenna apparatus without the first and second cavities C1 and C2, without a substantial change in position of the antenna pattern 120a. Alternatively, the antenna pattern 120a may be disposed closer to the first, third, fourth, and fifth ground layers 221a, 223a, 224a, and 225a in comparison to an antenna apparatus without the first and second cavities C1 and C2, without substantial sacrifice of antenna performance.

For example, an RF signal moving toward the first and second cavities C1 and C2, among RF signals transmitting through each pole of the antenna pattern 120a, may be further concentrated and reflected in the x direction, compared with a case in which the first and second cavities C1 and C2 are not present. Thus, a gain of the antenna pattern 120a may be further improved as compared with the case in which the first and second cavities C1 and C2 are not present.

For example, capacitance between each pole of the antenna pattern 120a and the first, third, fourth, and fifth ground layers 221a, 223a, 224a, and 225a may be smaller as compared with the case in which the first and second cavities C1 and C2 are not present. Therefore, a resonance frequency of the antenna pattern 120a may be further easily optimized.

Also, the first protruding region P1 may provide an additional resonance point in accordance with electromagnetic coupling with the antenna pattern 120a. The resonance point may be dependent on a shape (e.g., width, length, thickness, distance from the second and third protruding regions P2 and P3, and distance from to the antenna pattern 120a, etc.) of the first protruding region P1.

When the additional resonance point provided by the first protruding region P1 is close to a frequency band of the antenna pattern 120a, a bandwidth of the antenna pattern 120a may be extended. Further, the additional resonance point provided by the first protruding region P1 may support an additional frequency band of the antenna pattern 120a to enable multi-band communication of the antenna pattern 120a. Therefore, the first protruding region P1 may broaden a bandwidth of the antenna pattern 120a or extend a communication band of the antenna pattern 120a.

Also, the second and third protruding regions P2 and P3 may electromagnetically shield between the antenna pattern 120a and an adjacent antenna apparatus. Accordingly, a distance between the antenna pattern 120a and the adjacent antenna apparatus may be further reduced and the size of the antenna module may be reduced in comparison to an antenna module in which the second and third protruding regions P2 and P3 are not present.

Referring to FIGS. 1 and 2, the connection member 200a may further include shielding vias 245a electrically connected to at least two of the first, third, fourth, and fifth ground layers 221a, 223a, 224a, and 225a and arranged to surround at least a portion of each of the first and second cavities C1 and C2 when viewed in the vertical direction (z direction). That is, the shielding vias 245a may surround at least a portion of each of the first and second cavities C1 and C2 in the x direction and/or the y direction.

The shielding vias 245a may reflect an RF signal leaked to gaps between the first, third, fourth, and fifth ground layers 221a, 223a, 224a, and 225a, among RF signals transmitting through the antenna pattern 120a. Thus, the gain of the antenna pattern 120a may be further improved and electromagnetic isolation between the antenna pattern 120a and the wiring may be improved.

Still referring to FIGS. 1 and 2, the antenna apparatus 100 may include at least some of a feed line 110a, a feeding via 111a, the antenna pattern 120a, a director pattern 125a, and the connection member 200a.

Since the feed line 110a may be electrically connected to the wiring in the third ground layer 223a, the feed line 110a may act as a transfer path of the RF signal. The feed line 110a may be considered to be a component included in the third ground layer 223a. Since the antenna pattern 120a may be disposed adjacent to the side of the connection member 200a, the feed line 110a may have a structure extending from the wiring of the third ground layer 223a toward the antenna pattern 120a.

The feed line 110a may be disposed between at least two first protruding regions P1 of the first, third, fourth, and fifth ground layers 221a, 223a, 224a, and 225a. Accordingly, the feed line 110a may reduce electromagnetic noise that may be received from at least one of the antenna pattern 120a, the adjacent antenna apparatus, and the patch antenna pattern. Electromagnetic noise of the feed line 110a may be further reduced as the width (y direction) and length (x direction) of the first protruding region P1 are increased.

The feed line 110a may include first and second feed lines. For example, the first feed line may transfer an RF signal to the antenna pattern 120a, and the second feed line may receive the RF signal from the antenna pattern 120a. For example, the first feed line may receive an RF signal from the antenna pattern 120a or transfer an RF signal to the antenna pattern 120a, and the second feed line may provide impedance to the antenna pattern 120a.

For example, the first and second feed lines may each transfer an RF signal to the antenna pattern 120a and receive an RF signal from the antenna pattern 120a and may be configured in a differential feeding manner to have a phase difference (e.g., 180° and 90°). The phase difference may be realized through a phase shifter of the IC or a difference in electrical length between the first and second feed lines.

Meanwhile, according to the design, the feed line 110a may include a ¼ wavelength converter, a balun, or an impedance conversion line to improve RF signal transmission efficiency. However, the ¼ wavelength converter, the balun, or the impedance conversion line may be omitted depending on the design.

The feeding via 111a may be disposed to electrically connect the antenna pattern 120a and the feed line 110a. The feeding via 111a may be disposed perpendicular to the antenna pattern 120a and the feed line 110a. In an alternative example in which the antenna pattern 120a and the feed line 110a are arranged at the same height in the z direction, the feeding via 111a may be omitted.

Due to the feeding via 111a, the antenna pattern 120a may be disposed at a position higher or lower than the feed line 110a. A specific position of the antenna pattern 120a may vary depending on the length of the feeding via 111a, and thus, a radiation pattern direction of the antenna pattern 120a may be slightly tilted in the vertical direction (z direction) according to the length of the feeding via 111a.

For example, the antenna pattern 120a may be disposed below the feed line 110a to be vertically spaced from the second ground layer 222a by the feeding via 111a. Accordingly, the second ground layer 222a may further improve electromagnetic isolation between the antenna pattern 120a and the patch antenna pattern.

A via pattern 112a may be coupled to the feeding via 111a and may support each of upper and lower portions of the feeding via 111a.

The antenna pattern 120a may be electrically connected to the feed line 110a and transmit or receive an RF signal. One end of each pole of the antenna pattern 120a may be electrically connected to first and second lines of the feed line 110a.

The antenna pattern 120a may have a frequency band (e.g., 28 GHz, 60 GHz) in accordance with at least one of a pole length, a pole thickness, an interval between poles, a distance between a pole and a side surface of a connection member, and permittivity of an insulating layer.

The antenna pattern 120a and the director pattern 125a may be considered to be components included in the fourth ground layer 224a. The director pattern 125a may be omitted in alternative embodiments, depending on design and performance considerations.

The director pattern 125a may be laterally spaced apart from the antenna pattern 120a in the x direction. The director pattern 125a may be electromagnetically coupled to the antenna pattern 120a to improve a gain or a bandwidth of the antenna pattern 120a. Since the director pattern 125a has a length shorter than a total length of dipole of the antenna pattern 120a, concentration of electromagnetic coupling of the antenna pattern 120a may be further improved, and thus, a gain and directivity of the antenna pattern 120a may be further improved.

FIGS. 3A through 3D are plan views illustrating the first to fourth ground layers 221a, 222a, 223a, and 224a that may be included in the antenna apparatus 100 and an antenna module, according to an embodiment.

Figure 3A:
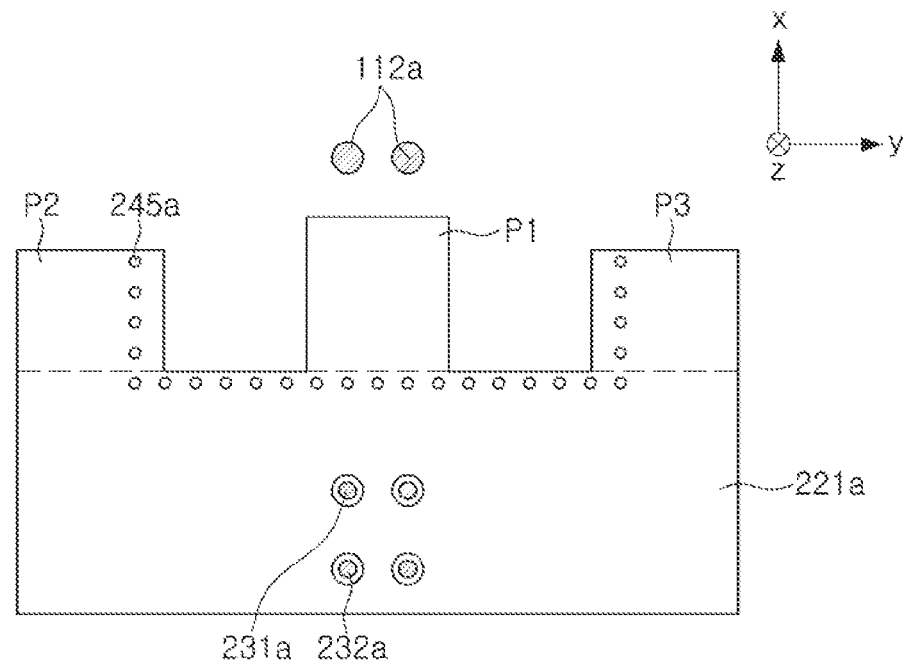
FIGS. 3A through 3D are plan views illustrating first to fourth ground layers that may be included in an antenna apparatus and an antenna module, according to embodiments.

Referring to FIG. 3A, the first protruding region P1 of the first ground layer 221a may protrude more in the x direction than the second and third protruding regions P2 and P3. Accordingly, the antenna pattern 120a may further improve electromagnetic coupling with respect to the first protruding region P1, while more easily providing an effective distance with respect to the first ground layer 221a. Therefore, the antenna performance of the antenna apparatus 100 may be further improved.

The first protruding region P1 may be included in the first ground layer 221a and may be considered to be a protruding ground pattern electrically connected to the first ground layer 221a as a separate component, depending on viewpoints.

The shielding vias 245a may be electrically connected to the first ground layer 221a and may be arranged along the boundary of a region between the second and third protruding regions P2 and P3. In addition, the first ground layer 221a may have through holes through which first and second wiring vias 231a and 232a pass. Meanwhile, the via pattern 112a coupled to the feeding via 111a may be considered to be a component included in the first ground layer 221a, depending on viewpoints.

Figure 3B:
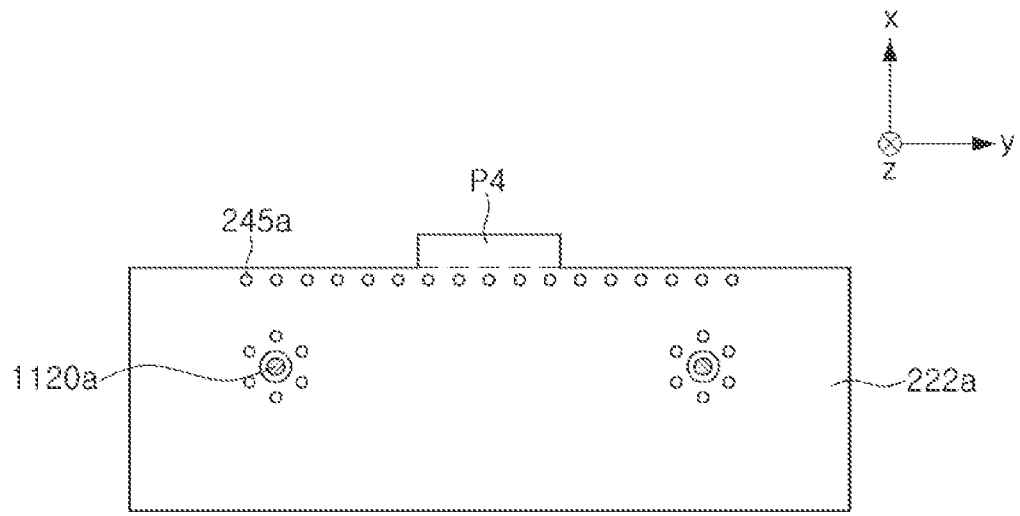

Referring to FIGS. 3A and 3B, the second ground layer 222a may have a fourth protruding region P4, overlap a region (a first cavity) between the first protruding region P1 and the second protruding region P2 of the first ground layer 221a, and overlap a region (a second cavity) between the first protruding region P1 and the third protruding region P3 of the first ground layer 221a when viewed in the vertical direction (Z direction). That is, the fourth protruding region P4 may overlap the first cavity between the first protruding region P1 and the second protruding region P2 of the first ground layer 221a in the x and y directions, and the fourth protruding region P4 may overlap the second cavity between the first protruding region P1 and the third protruding region P3 of the first ground layer 221a in the x and y directions. Accordingly, the antenna pattern 120a may further improve electromagnetic coupling with respect to the fourth protruding region P4 and provide electromagnetic isolation with respect to the patch antenna pattern disposed on the upper side. Therefore, antenna performance of the antenna apparatus 100 and the antenna module may be further improved.

Also, the shielding vias 245a may be electrically connected to the second ground layer 222a and may be arranged along the boundary of the second ground layer 222a. In addition, the second ground layer 222a may have a through hole through which a second feeding via 1120a passes. The second feeding via 1120a may electrically connect the patch antenna pattern and a second wiring.

Figure 3C:
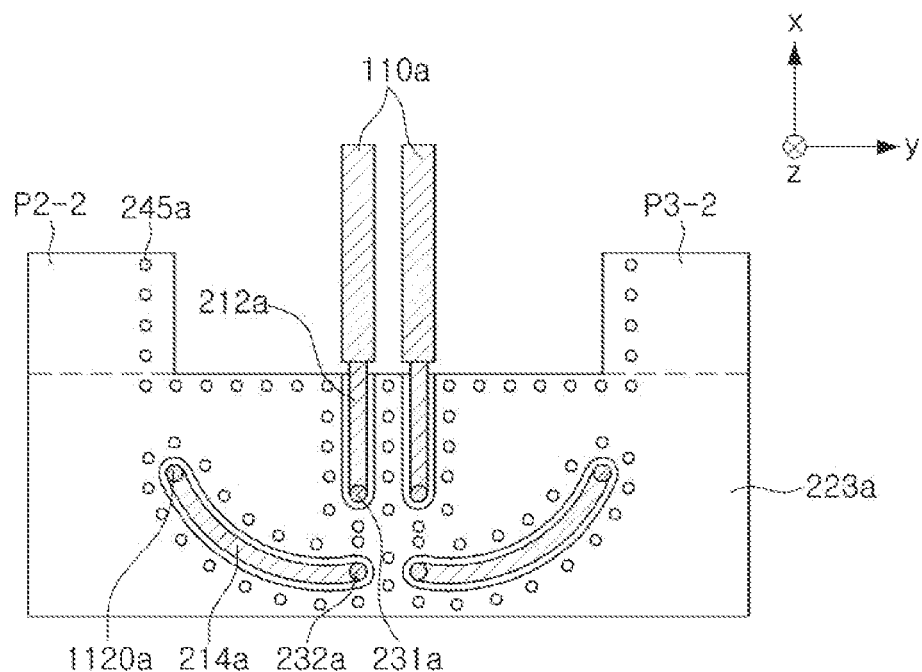

Referring to FIG. 3C, the antenna apparatus 100 and the antenna module may include a first wiring 212a for electrically connecting the feed line 110a and the first wiring via 231a to each other, and a second wiring 214a electrically connecting the second via 1120a and the second wiring via 232a to each other.

The third ground layer 223a may be disposed to surround each of the first wiring 212a and the second wiring 214a. Accordingly, electromagnetic noise of each of the first wiring 212a and the second wiring 214a may be reduced.

The shielding vias 245a may be electrically connected to the third ground layer 223a and may be arranged along the boundary of the third ground layer 223a and the first and second wirings 212a and 214a. Accordingly, electromagnetic noise of each of the first wiring 212a and the second wiring 214a may be further reduced.

Referring to FIGS. 3A and 3C, the third ground layer 223a may be configured such that a region of the third ground layer 223a between the second protruding region P2 and the third protruding region P3 of the first ground layer 221a is recessed when viewed in the vertical direction (z direction). In other words, a region of the third ground layer 223a between the second protruding region P2 and the third protruding region P3 of the first ground layer 221a may be recessed in a direction opposite the x direction. That is, the third ground layer 223a may have a second protruding region P2-2 and a third protruding region P3-2.

Figure 3D:
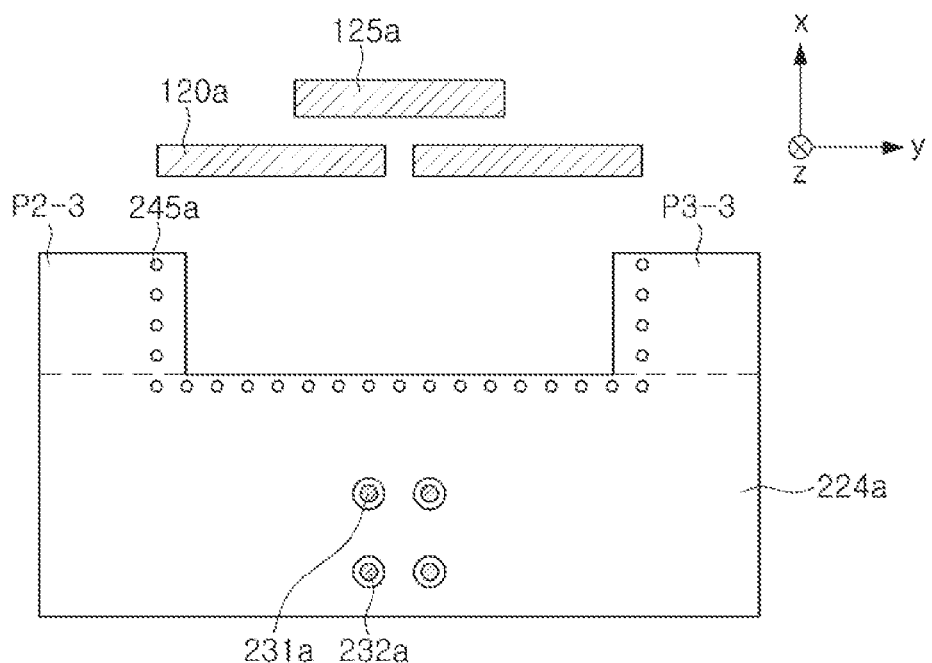

Referring to FIGS. 3A and 3D, the fourth ground layer 224a may be configured such that a region of the fourth ground layer 224a between the second protruding region P2 and the third protruding region P3 of the first ground layer 221a is recessed when viewed in the vertical direction (Z direction). In other words, a region of the fourth ground layer 224a between the second protruding region P2 and the third protruding region P3 of the first ground layer 221a may be recessed in a direction opposite the x direction. That is, the fourth ground layer 224a may have a second protruding region P2-3 and a third protruding region P3-3.

The shielding vias 245a may be electrically connected to the fourth ground layer 224a and arranged to surround a region between the second protruding area P2-3 and the third protruding area P3-3.

The fourth ground layer 224a may have through holes through which the first and second wiring vias 231a and 232a pass. The first and second wiring vias 231a and 232a may be electrically connected to the IC disposed below the fourth ground layer 224a.

The antenna pattern 120a and the director pattern 125a may be considered to be components included in the fourth ground layer 224a, depending on viewpoints.

As the number of ground layers providing the cavities, among the first, third, fourth, and fifth ground layers 221a, 223a, 224a, and 225a, increases, the length of the cavities in the vertical direction (z direction) may be increased. The length of the cavities in the vertical direction (z direction) may affect antenna performance of the antenna pattern 120a. In the antenna apparatus 100 and the antenna module, since the length of the cavities in the z direction may be easily adjusted by adjusting the number of the ground layers providing the cavities, antenna performance of the antenna 120a may be adjusted more easily as compared to conventional antenna apparatuses.

Recessed regions of at least two of the first, third, fourth, and fifth ground layers 221a, 223a, 224a, and 225a may have the same rectangular shape. Accordingly, the cavities may form a rectangular parallelepiped. When the cavities are a rectangular parallelepiped, the ratio of an x vector component of the RF signal reflected from the boundary of the cavities, among the x vector component and a y vector component, may be further increased. Since the y vector component is more easily canceled out in the cavities than the x vector component, the antenna pattern 120a may have a higher gain ratio as the ratio of the x vector component of the RF signal reflected from the boundary of the cavities increases. Accordingly, the antenna pattern 120a may have a further improved gain as the cavities are configured closer to a rectangular parallelepiped.

Figure 4A:
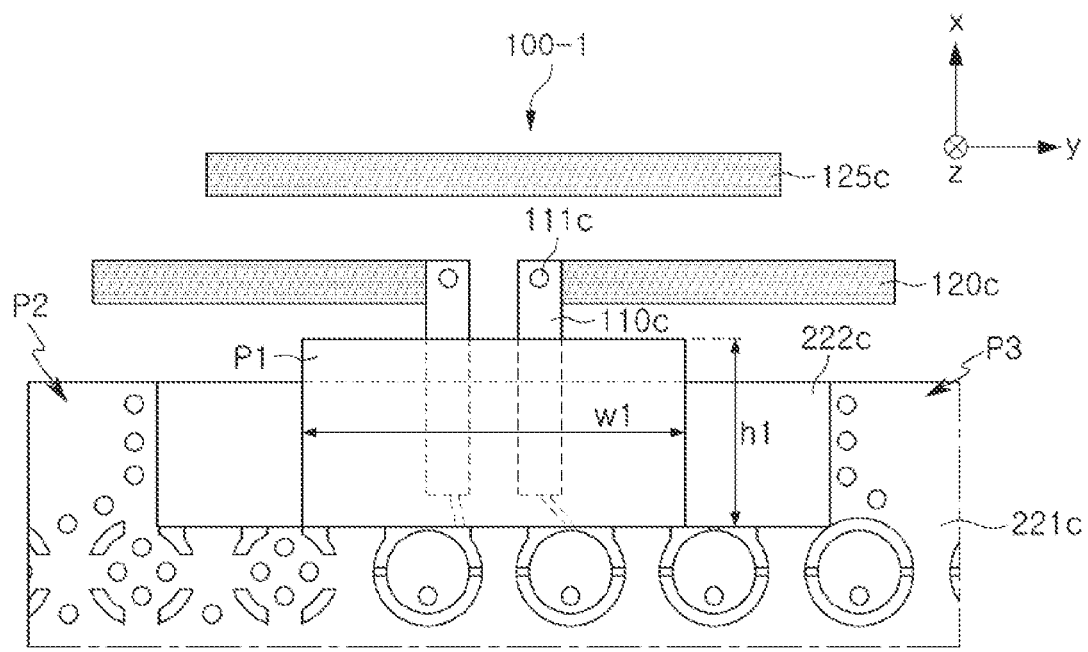
FIGS. 4A through 4C are plan views illustrating various sizes of first to third protruding regions of an antenna apparatus, according to embodiments.
Figure 4B:
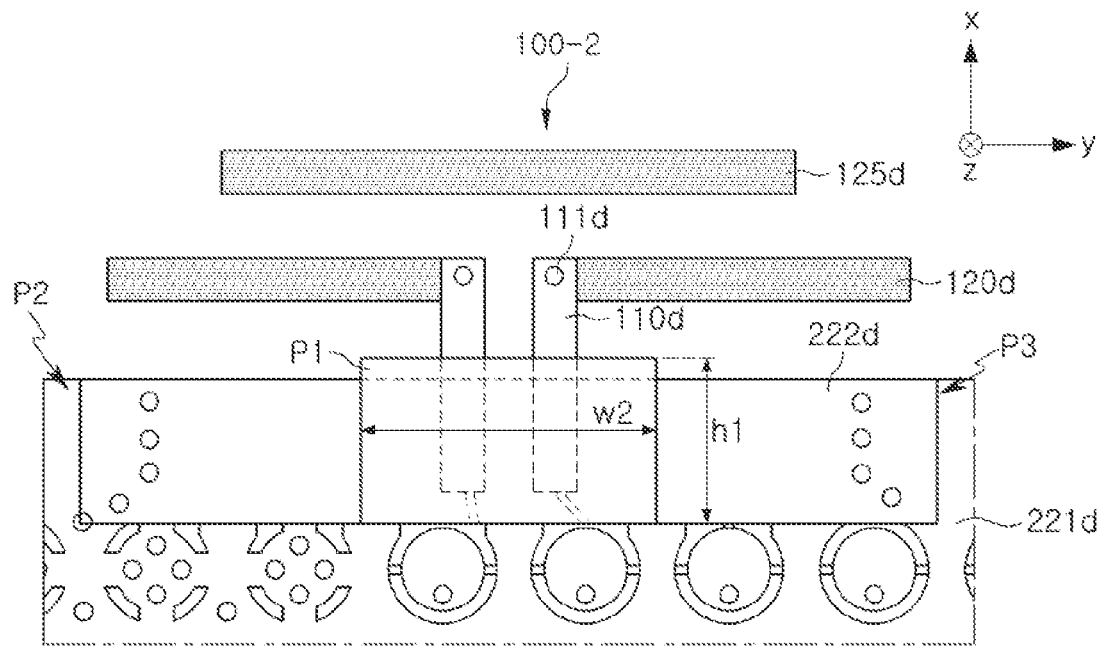
Figure 4C:
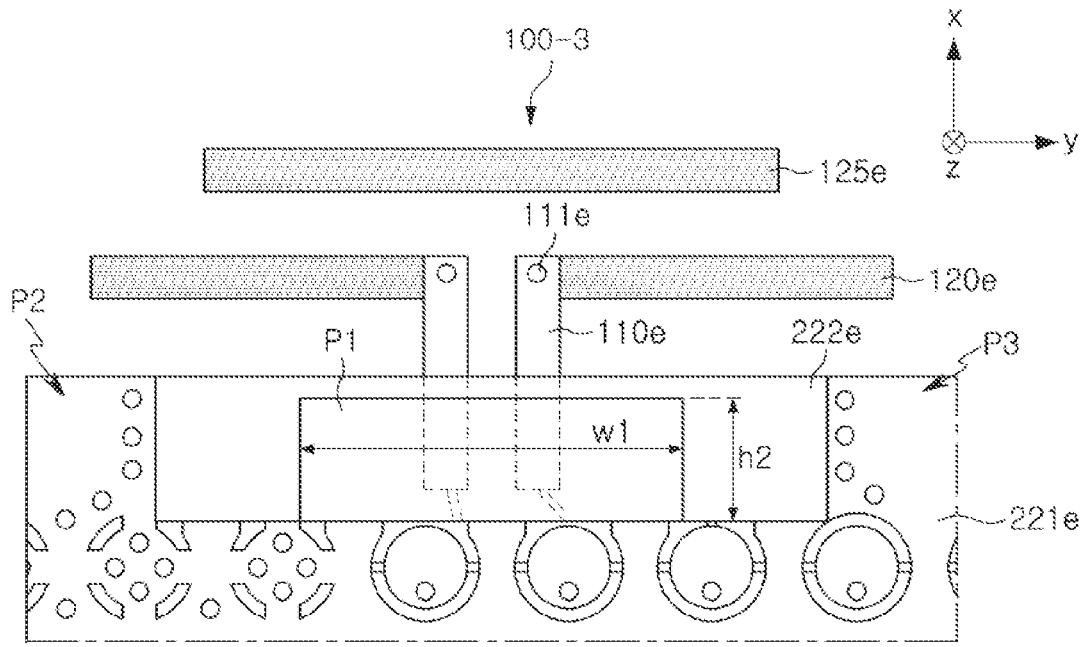
Figure 4D:
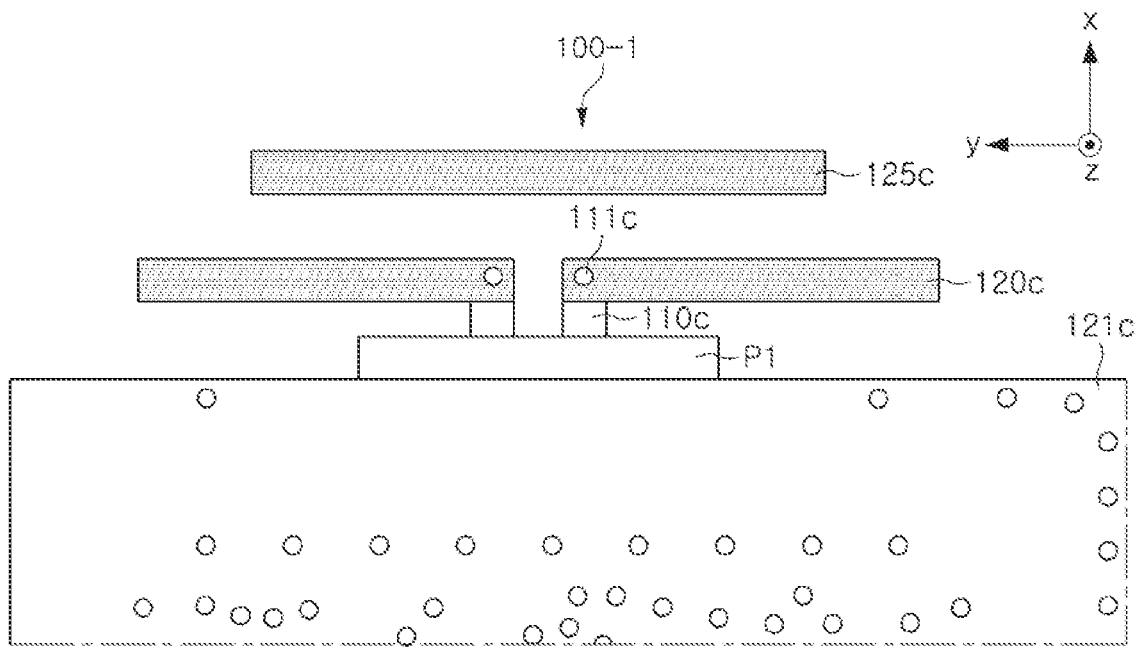
FIG. 4D is a rear view of the antenna apparatus illustrated in FIG. 4A.

FIGS. 4A through 4C are plan views illustrating various sizes of first to third protruding regions P1 to P3 of antenna apparatuses 100-1, 100-2, and 100-3, according to embodiments. FIG. 4D is a rear view of the antenna apparatus 100-1 illustrated in FIG. 4A.

Referring to FIGS. 4A through 4C, the antenna apparatuses 100-1, 100-2, and 100-3 and the corresponding antenna modules may respectively include feed lines 110c, 110d, and 110e, feeding vias 111c, 111d, and 111e, antenna patterns 120c, 120d, and 120e, director patterns 125c, 125d, and 125e, first ground layers 221c, 221d, and 221e, and second ground layers 222c, 222d, and 222e.

Referring to the antenna apparatus 100-1 of FIG. 4A, the first protruding region P1 of the first ground layer 221c may have a first width w1 and a first height h1. Referring to the antenna apparatus 100-2 of FIG. 4B, the first protruding region P1 of the first ground layer 221d may have a second width w2 and the first height h1. Referring to the antenna apparatus 100-3 of FIG. 4C, the first protruding region P1 of the first ground layer 221e may have the first width w1 and a second height h2.

The second width w2 may be shorter than the first width w1. Accordingly, band positions and bandwidths of the antenna patterns 120c, 120d, and 120e may be changed.

The first height h1 of the first protruding area P1 may be longer than the protruding length of the second and third protruding areas P2 and P3, and the second height h2 may be shorter than the protruding length of the second and third protruding regions P2 and P3.

The distance between the antenna patterns 120c, 120d, and 120e and the first protruding region P1 in the x direction may be shorter than the protruding length of the regions P2 and P3 in the x direction. Accordingly, the antenna apparatuses 100-1, 100-2, and 100-3 and the corresponding antenna modules may have a reduced size, in comparison to conventional antenna apparatuses and antenna modules, without significantly hindering RF signal reflection performance of the first ground layers 221c, 221d, and 221e.

The length of a first pole of the antenna patterns 120c and 120e in the y direction may be longer than the distance between (the first cavity) the first protruding region P1 and the second protruding region P2 of the first ground layers 221c and 221e in they direction, and the length of a second pole of the antenna patterns 120c and 120e in the y direction may be greater than the distance (the second cavity) between the first protruding region P1 and the third protruding region P3 of the first ground layers 221c and 221e in they direction. Accordingly, the first ground layers 221c and 221e may reflect the RF signal of the antenna patterns 120c and 120e, respectively, while further concentrating the RF signal in a specific direction (x direction).

Also, the length of the director patterns 125c and 125e in the length direction of the director patterns 125c and 125e (y direction) may be shorter than the length of the space between the second protruding region P2 and the third protruding region P3 of the first ground layers 221c and 221e in the y direction, and longer than the length of the first protruding region P1 of the first ground layers 221c and 221e in the width direction (y direction) of the first protruding region P1 of the first ground layers 221c and 221e. Accordingly, the antenna apparatuses 100-1 and 100-3 and the corresponding antenna modules may have a reduced size, while ensuring antenna performance (e.g., bandwidth, directivity, etc.).

Figure 5:
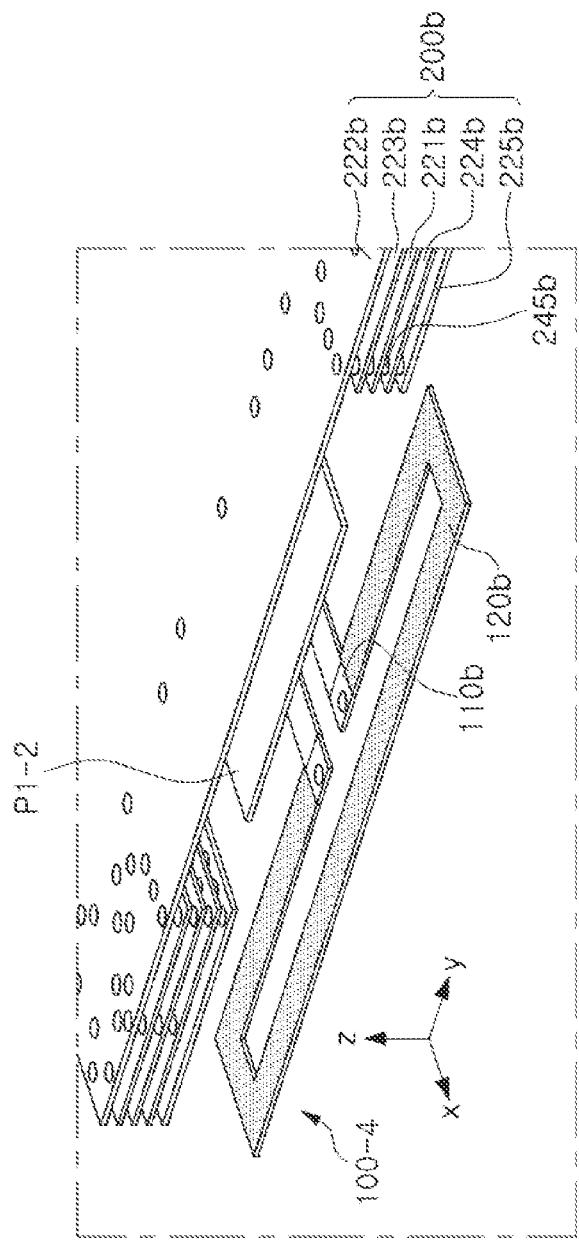
FIG. 5 is a perspective view illustrating an antenna apparatus, according to an embodiment.
Figure 6:
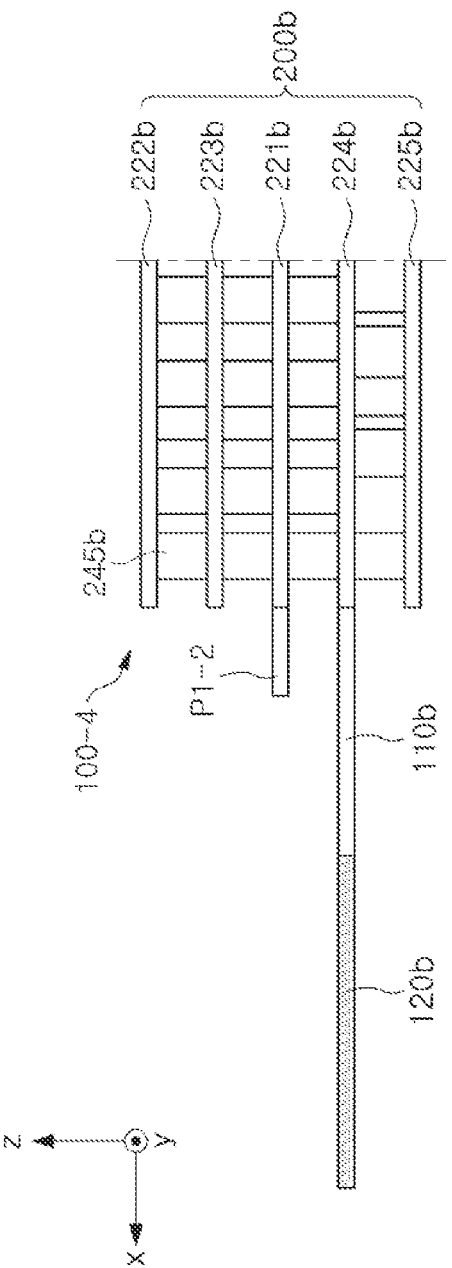
FIG. 6 is a side view illustrating the antenna apparatus illustrated in FIG. 5.

FIG. 5 is a perspective view illustrating an antenna apparatus 100-4, according to an embodiment. FIG. 6 is a side view illustrating the antenna apparatus 100-4.

Referring to FIGS. 5 and 6, an antenna pattern 120b may have a form of a folded dipole, and the feeding via and the director pattern may be omitted.

A feed line 110b may be disposed at the same height in the z direction as a fourth ground layer 224b and may be electrically connected to a first wiring surrounded by the fourth ground layer 224b.

A connection member 200b may include at least one of first, second, third, fourth, and fifth ground layers 221b, 222b, 223b, 224b, and 225b and shielding vias 245b. The fourth protruding region of the second ground layer 222b may be omitted.

The first ground layer 221b may be recessed in a direction in which the feed line 110b extends from the antenna pattern 120b (e.g., the x direction), and may include a protruding ground pattern P1-2. The protruding ground pattern P1-2 may correspond to the first protruding region described above.

Depending on the design, the fifth ground layer 225b may have a protruding region. The protruding region and the protruding ground pattern P1-2 may be electromagnetically coupled to the antenna pattern 120b and may provide a boundary of the first and second cavities described above.

Figure 7:
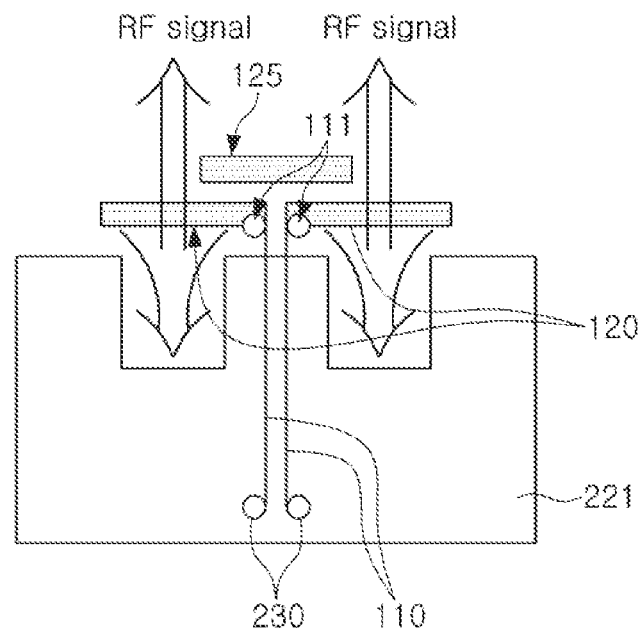
FIG. 7 is a view illustrating a transmission direction of an RF signal according to cavities of an antenna apparatus, according to an embodiment.

FIG. 7 is a view illustrating a transmission direction of an RF signal according to cavities of an antenna apparatus, according to an embodiment.

Referring to FIG. 7, an RF signal transmitted through the wiring via 230, then through the feed line 110, and then through the feeding via 111 may transmit through each pole of the antenna pattern 120. A portion of the RF signal transmitting through each pole of the antenna pattern 120 may be radiated forward through the director pattern 125.

Among the RF signals transmitting through each pole of the antenna pattern 120, the RF signal transmitting toward the first ground layer 221 may be further concentrated by the first and second cavities of the first ground layer 221 and may be reflected from the boundary of the first and second cavities. The reflected RF signal may be further concentrated to transmit on the front side of the antenna pattern 120. Therefore, the gain of the antenna apparatus may be further improved as compared to conventional antenna apparatuses.

FIGS. 8A through 8D are plan views illustrating various arrangements of antenna apparatuses included in antenna modules 1000, 1000-1, 1000-2, and 1000-3, respectively, according to embodiments.

Figure 8A:
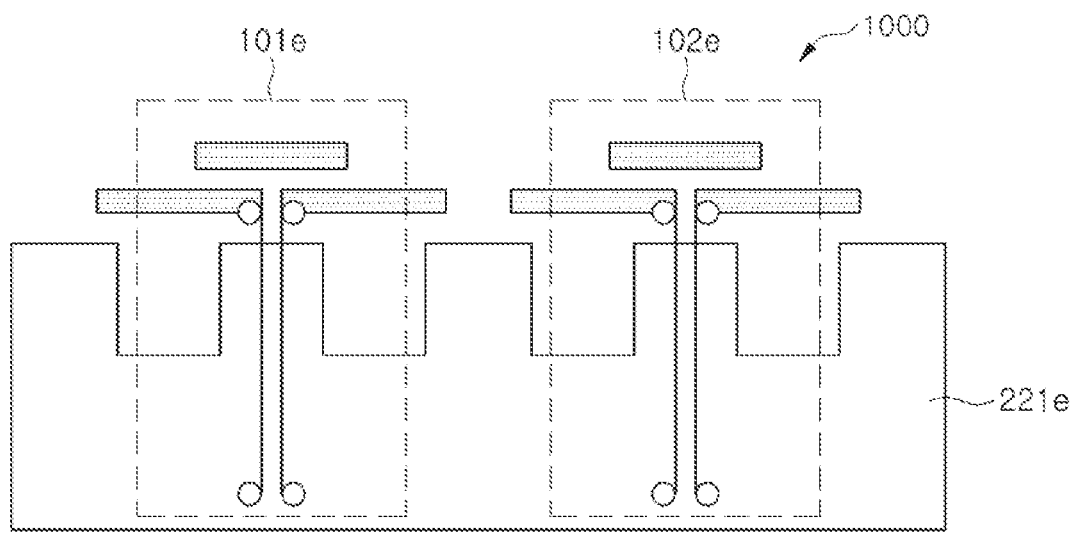
FIGS. 8A to 8D are plan views illustrating various arrangements of an antenna apparatus included in an antenna module, according to embodiments.

Referring to FIG. 8A, the antenna module 1000 may include a first antenna apparatus 101e, a second antenna apparatus 102e, and a first ground layer 221e.

Figure 8B:
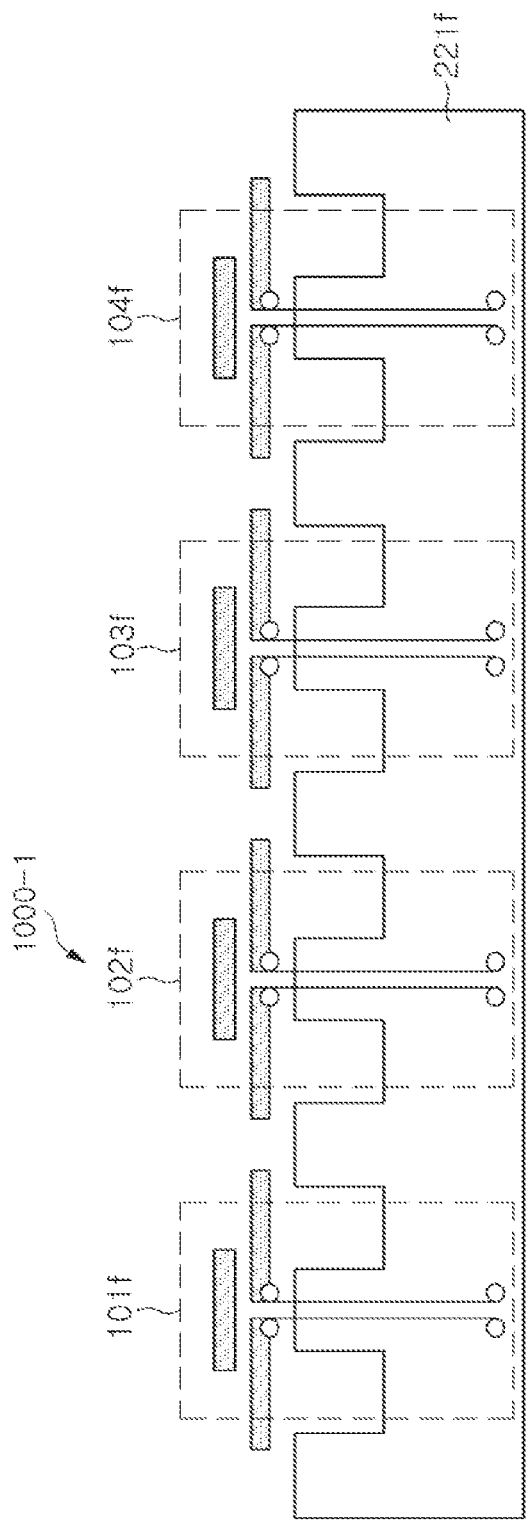

Referring to FIG. 8B, the antenna module 1000-1 may include a first antenna apparatus 101f, a second antenna apparatus 102f, a third antenna apparatus 103f, a fourth antenna apparatus 104f, and a first ground layer 221f.

Figure 8C:
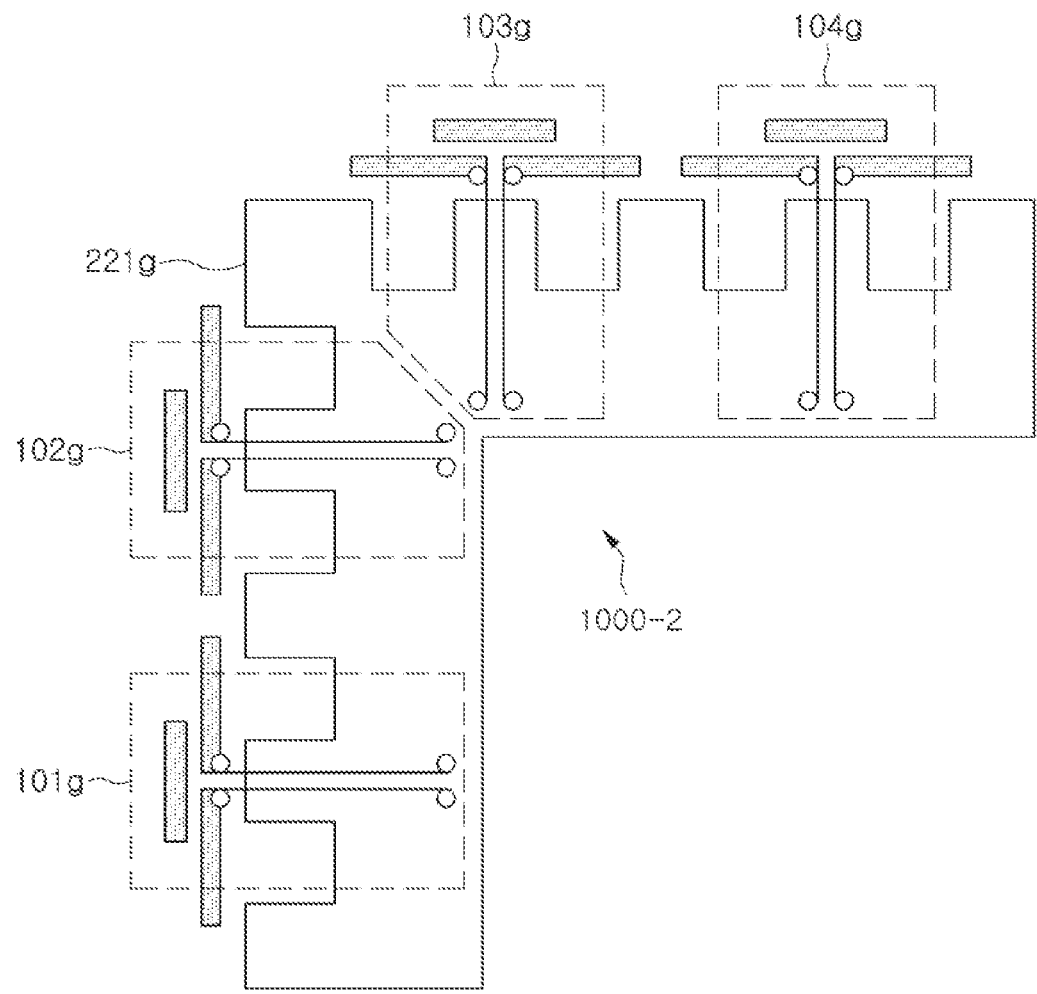

Referring to FIG. 8C, the antenna module 1000-2 may include a first antenna apparatus 101g, a second antenna apparatus 102g, a third antenna apparatus 103g, a fourth antenna apparatus 104g, and a first ground layer 221g.

In the antenna modules 1000-1, 1000-2, and 1000-3, an antenna package may be omitted.

Figure 8D:
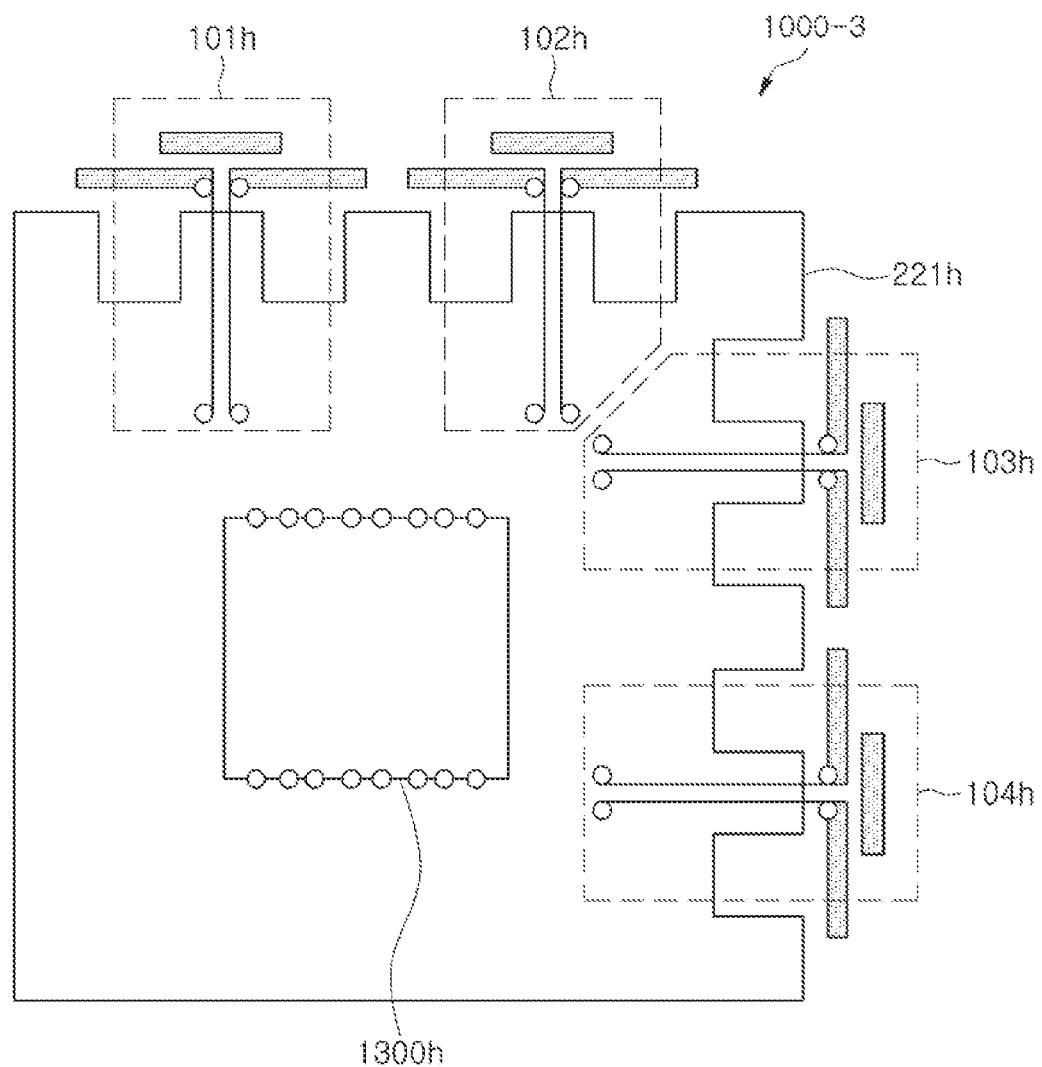

Referring to FIG. 8D, the antenna module 1000-3 may include a first antenna apparatus 101h and a second antenna 102h, a third antenna apparatus 103h, a fourth antenna apparatus 104h, a first ground layer 221h, and an IC 1300h.

The first ground layers 221e, 221f, 221g, and 221h improve isolation between the respective antenna apparatuses therein and may provide specific disposition positions of the respective antenna apparatuses.

Figure 9:
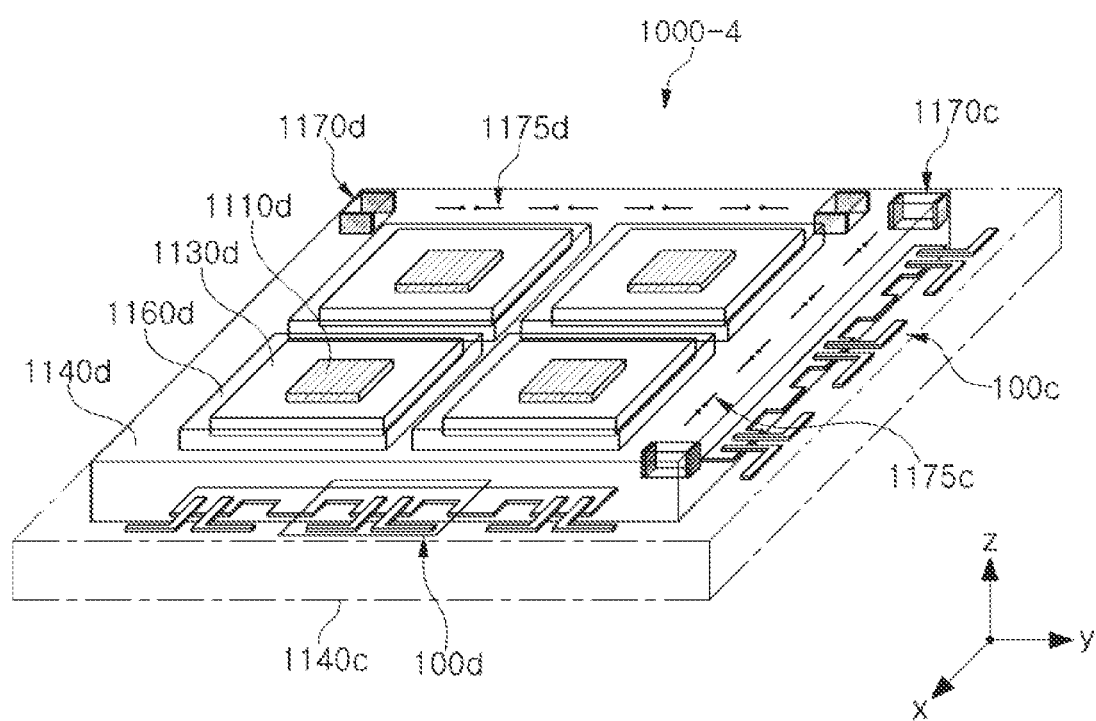
FIG. 9 is a perspective view illustrating an arrangement of antenna apparatuses included in an antenna module, according to an embodiment.

FIG. 9 is a perspective view illustrating an arrangement of antenna apparatuses 100c and 100d included in an antenna module 1000-4.

Referring to FIG. 9, the antenna module 1000-4 may include the antenna apparatuses 100c and 100d, patch antenna patterns 1110d, patch antenna cavities 1130d, dielectric layers 1140c and 1140d, a plating member 1160d, chip antennas 1170c and 1170d, and dipole antennas 1175c and 1175d.

The antenna apparatuses 100c and 100d may be similar to the antenna apparatuses described above with reference to FIGS. 1 through 8 and may be arranged in parallel adjacent to the side of the antenna module 1000-4. Accordingly, some of the antenna apparatuses 100c and 100d may transmit and receive RF signals in the x-axis direction and others of the antenna apparatuses 100c and 100d may transmit and receive RF signals in the y-axis direction.

The patch antenna patterns 1110d may be disposed adjacent to an upper side of the antenna module 1000-4 and may transmit and receive RF signals in the vertical direction (z direction). The number, arrangement, and shape of the patch antenna patterns 1110d are not limited. For example, the patch antenna patterns 1110d may have a circular shape and may be arranged in a structure of 1×n (where n is a natural number of 2 or greater), and the number of patch antenna patterns may be sixteen.

The patch antenna cavities 1130d may be formed to cover side surfaces and lower sides of the patch antenna patterns 1110d, respectively, and may provide boundary conditions for transmitting and receiving RF signals of the patch antenna patterns 1110d, respectively.

The chip antennas 1170c and 1170d may include two electrodes opposing each other, may be disposed on an upper side or a lower side of the antenna module, and may be disposed to transmit and receive an RF signal in the x-axis direction and/or in the y-axis direction through one of two electrodes.

The dipole antennas 1175c and 1175d may be disposed on the upper side or the lower side of the antenna module 1000-4, and may transmit and receive RF signals in the z axis direction. That is, the dipole antennas 1175c and 1175d may be disposed upright in the vertical direction (z direction) so as to be perpendicular to the antenna apparatuses 100c and 100d. Depending on the design, at least some of the dipole antennas 1175c and 1175d may be replaced by monopole antennas.

Figure 10A:
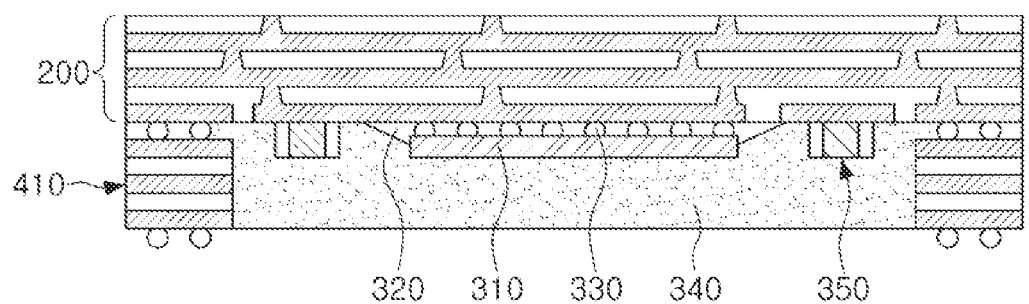
FIGS. 10A and 10B are views illustrating a lower structure of a connection member included in an antenna module, according to an embodiment.
Figure 10B:
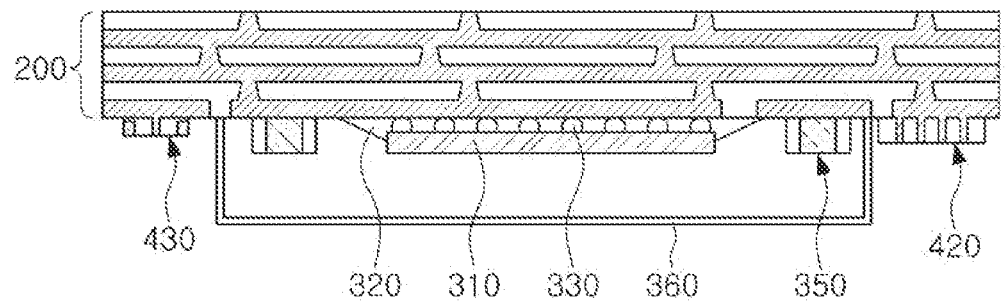

FIGS. 10A and 10B are views illustrating a lower structure of a connection member 200 of the antenna module including an antenna apparatus, according to an embodiment.

Referring to FIG. 10A, an antenna module may include at least some of the connection member 200, an IC 310, an adhesive member 320, an electrical connection structure 330, an encapsulant 340, a passive component 350, and a sub-board 410.

The connection member 200 may have a structure similar to that of the connection members 200a and 200b described above with reference to FIGS. 1 through 8.

The IC 310 is the same as the IC described above, and may be disposed on a lower side of the connection member 200. The IC 310 may be electrically connected to the wiring of the connection member 200 to transmit or receive an RF signal and may be electrically connected to the ground layer of the connection member 200 to receive a ground. For example, the IC 310 may perform at least some of frequency conversion, amplification, filtering, phase control, and power generation to produce a converted signal.

The adhesive member 320 may adhere the IC 310 and the connection member 200 to each other.

The electrical connection structure 330 may electrically connect the IC 310 and the connection member 200. For example, the electrical connection structure 330 may have a structure such as a solder ball, a pin, a land, or a pad. The electrical connection structure 330 may have a melting point lower than melting points of the wiring and the ground layer of the connection member 200, and thus, the electrical connection structure 330 may electrically connect the IC 310 and the connection member 200 through a predetermined process using the low melting point.

The encapsulant 340 may encapsulate at least a portion of the IC 310 and improve heat dissipation performance and shock protection performance of the IC 310. For example, the encapsulant 340 may be a photo imageable encapsulant (PIE), an Ajinomoto build-up film (ABF), or an epoxy molding compound (EMC).

The passive component 350 may be disposed on a lower surface of the connection member 200 and may be electrically connected to the wiring and/or the ground layer of the connection member 200 through the electrical connection structure 330.

The sub-board 410 may be disposed below the connection member 200 and may be electrically connected to the connection member 200 to receive an intermediate frequency (IF) signal or a baseband signal from the outside and transfer the received signal to the IC 310 or receive an IF signal or a baseband signal from the IC 310 and transfer the received signal to the outside. For example, a frequency (e.g., 24 GHz, 28 GHz, 36 GHz, 39 GHz, and 60 GHz) of the RF signal may be higher than a frequency (e.g., 2 GHz, 5 GHz, 10 GHz, etc.) of the IF signal.

For example, the sub-board 410 may transfer or receive an IF signal or a baseband signal to or from the IC 310 through the wiring included in an IC ground layer of the connection member 200. Since the first ground layer of the connection member 200 is disposed between the IC ground layer and the wiring, the IF signal or the baseband signal and the RF signal may be electrically isolated in the antenna module.

Referring to FIG. 10B, an antenna module may include at least some of a shielding member 360, a connector 420, and a chip antenna 430.

The shielding member 360 may be disposed below the connection member 200 and confine the IC 310 together with the connection member 200. For example, the shielding member 360 may be disposed to cover the IC 310 and the passive component 350 together (e.g., conformal shield) or cover the IC 310 and passive component 350 separately (e.g., compartment shield). For example, the shielding member 360 may have a shape of hexahedron in which one side is open, and may form a hexahedral accommodation space through coupling with the connection member 200. The shielding member 360 may be formed of a material having high conductivity such as copper, may have a short skin depth, and may be electrically connected to the ground layer of the connection member 200. Accordingly, the shielding member 360 may reduce electromagnetic noise that may act on the IC 310 and the passive component 350.

The connector 420 may have a connection structure of a cable (e.g., a coaxial cable, or a flexible PCB), may be electrically connected to the IC ground layer of the connection member 200, and may have a role similar to that of the sub-board described above. That is, the connector 420 may be provided with an IF signal, a baseband signal, and/or power from a cable, or may provide an IF signal and/or a baseband signal to the cable.

The chip antenna 430 may transmit or receive an RF signal to assist the antenna apparatus according to an embodiment. For example, the chip antenna 430 may include a dielectric block having permittivity higher than that of the insulating layer and electrodes disposed on both sides of the dielectric block. One of the electrodes may be electrically connected to the wiring of the connection member 200 and the other of the electrodes may be electrically connected to the ground layer of the connection member 200.

Figure 11:
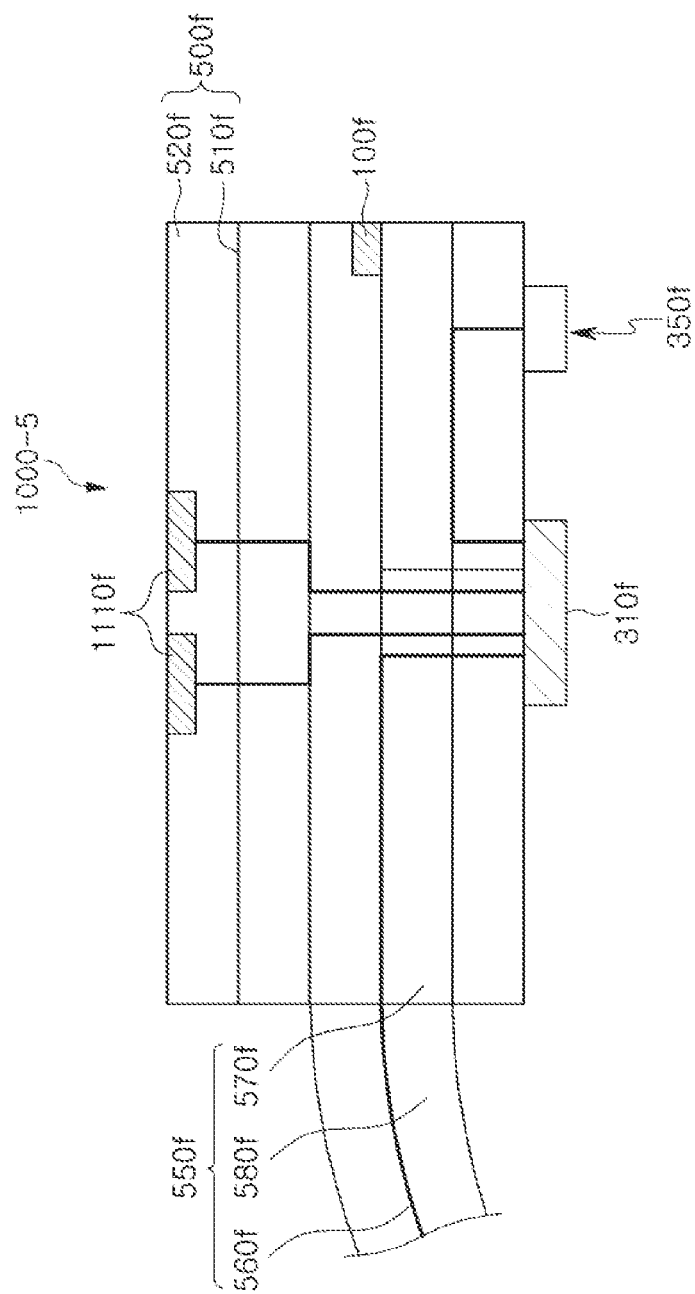
FIG. 11 is a side view illustrating a schematic structure of an antenna module, according to an embodiment.

FIG. 11 is a side view illustrating a schematic structure of an antenna module 1000-5 including an antenna apparatus 100f, according to an embodiment.

Referring to FIG. 11, the antenna module 1000-5 may include the antenna apparatus 100f, a patch antenna pattern 1110f, an IC 310f, and a passive component 350f integrated in a connection member 500f.

The antenna apparatus 100f and the patch antenna pattern 1110f may be the same as the antenna apparatus 100c/100d and the patch antenna pattern 1100d described above, and may receive an RF signal from the IC 310f and transmit the received RF signal, or transfer a received RF signal to the IC 310f.

The connection member 500f may have a structure in which at least one conductive layer 510f and at least one insulating layer 520f are stacked (e.g., a structure of a printed circuit board (PCB)). The conductive layer 510f may include the ground layer and the wiring described above.

Furthermore, the antenna module 1000-5 may further include a flexible connection member 550f. The flexible connection member 550f may include a first flexible region 570f overlapping the connection member 500f and a second flexible region 580f not overlapping the connection member 500f, when viewed in the vertical direction. That is, the first flexible region 570f may overlap the connection member 500f in the xy plane, and the second flexible region 580f may not overlap the connection member 500f in the xy plane.

The second flexible region 580f may be bent flexibly in the vertical direction. Accordingly, the second flexible region 580f may be flexibly connected to a connector and/or an adjacent antenna module of a set board.

The flexible connection member 550f may include a signal line 560f. An intermediate frequency (IF) signal and/or baseband signal may be transferred to the IC 310f via the signal line 560f or to the connector and/or the adjacent antenna module of the set board.

Figure 12A:
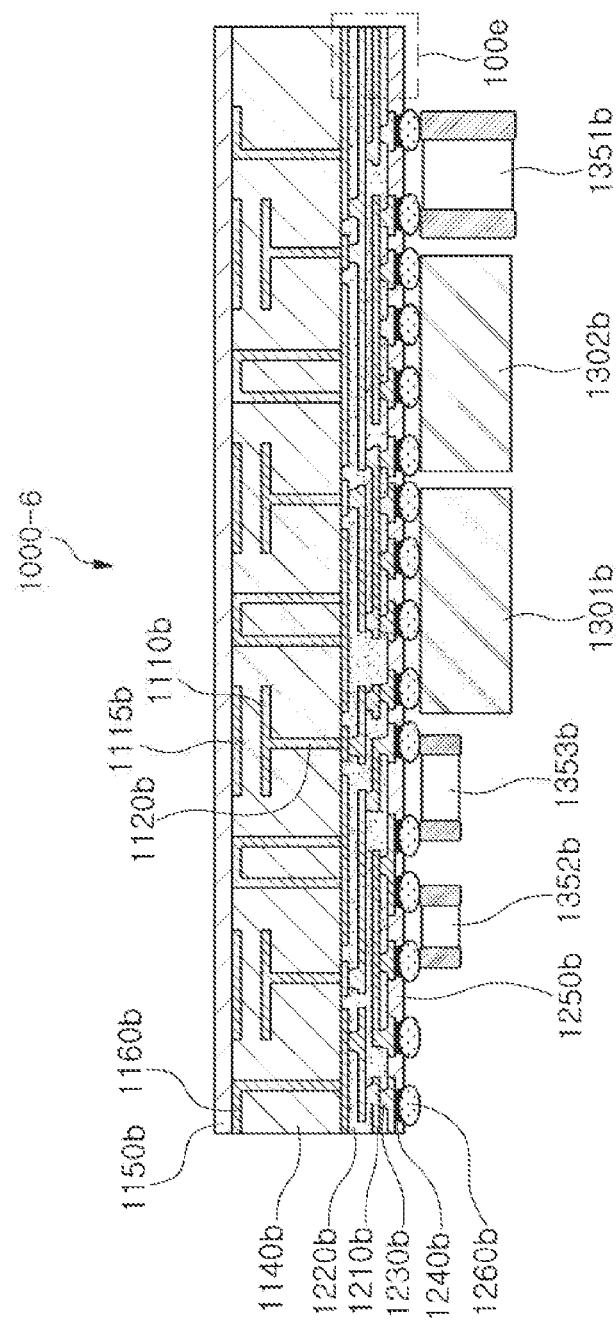
FIGS. 12A and 12B are side views illustrating various structures of antenna modules, according to embodiments.
Figure 12B:
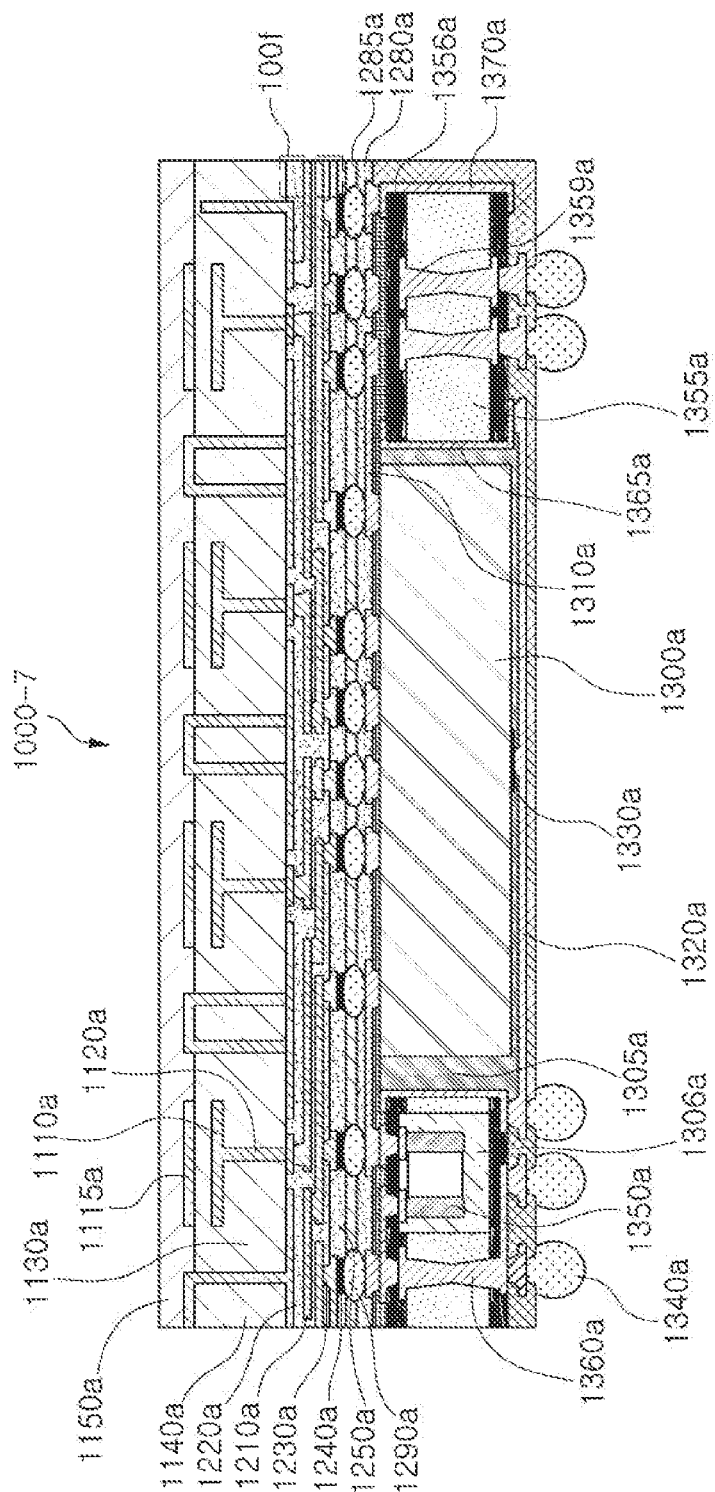

FIGS. 12A and 12B are side views illustrating various structures of antenna modules 1000-6 and 1000-7 including antenna apparatuses 100e and 100f, respectively, according to embodiments.

Referring to FIG. 12A, the antenna module 1000-6 may have a structure in which the antenna package 100e and a connection member are combined.

The connection member may include at least one conductive layer 1210b and at least one insulating layer 1220b, may include a wiring via 1230b connected to the at least one conductive layer 1210b and a connection pad 1240b connected to the wiring via 1230b, and may have a structure similar to that of a copper redistribution layer (RDL). An antenna package may be disposed on an upper surface of the connection member.

The antenna package may include at least some of patch antenna patterns 1110b, upper coupling patterns 1115b, patch antenna feeding vias 1120b, a dielectric layer 1140b, and an encapsulation member 1150b.

First ends of the patch antenna feeding vias 1120b may be electrically connected to the patch antenna patterns 1110b, respectively, and second ends of the patch antenna feeding vias 1120b may each be electrically connected to a wiring corresponding to at least one conductive layer 1210b of the connection member.

The dielectric layer 1140b may be disposed to encompass a side surface of each of the feeding vias 1120b. The dielectric layer 1140b may have a height greater than a height of the at least one insulating layer 1220b of the connection member. In the antenna package, a greater height and/or width of the dielectric layer 1140b may be more advantageous in terms of ensuring antenna performance, and may provide boundary conditions (e.g., small manufacturing tolerance, a short electrical length, a smooth surface, a large size of a dielectric layer, dielectric constant control, etc.) advantageous for an RF signal transmission/reception operation of the antenna patterns 1115b.

The encapsulation member 1150b may be disposed on the dielectric layer 1140b and may enhance durability with respect to an impact or oxidation of the plurality of patch antenna patterns 1110b and/or the plurality of upper coupling patterns 1115b. For example, the encapsulation member 1150b may be implemented as a photo imageable encapsulant (PIE), an Ajinomoto build-up film (ABF), or an epoxy molding compound (EMC), but is not limited thereto.

An IC 1301b, a PMIC 1302b, and a plurality of passive components 1351b, 1352b, and 1353b may be disposed on a lower surface of the connection member.

The PMIC 1302b may generate power and deliver the generated power to the IC 1301b through at least one conductive layer 1210b of the connection member.

The passive components 1351b, 1352b, and 1353b may provide impedance to the IC 1301b and/or the PMIC 1302b. For example, the plurality of passive components 1351b,

1352*b*, and 1353*b* may include at least some of a capacitor (e.g., a multilayer ceramic capacitor (MLCC)), an inductor, and a chip resistor.

Referring to FIG. 12B, the antenna module 1000-7 may be an IC package including an IC 1300*a*, an encapsulant 1305*a* encapsulating at least a portion of the IC 1300*a*, a support member 1355*a* disposed such that a first side surface thereof faces the IC 1300*a*, and a connection member including at least one conductive layer 1310*a* and an insulating layer 1280*a* electrically connected to the IC 1300*a* and the support member 1355*a*, and may be coupled to a connection member or the antenna package 100*f*.

The connection member may include at least one conductive layer 1210*a*, at least one insulating layer 1220*a*, a wiring via 1230*a*, a connection pad 1240*a*, and a passivation layer 1250*a*. The antenna package may include patch antenna patterns 1110*a*, 1110*b*, 1110*c* and 1110*d*, upper coupling patterns 1115*a*, 1115*b*, 1115*c* and 1115*d*, patch antenna feeding vias 1120*a*, 1120*b*, 1120*c*, and 1120*d*, a dielectric layer 1140*a*, and an encapsulation member 1150*a*.

The IC package may be coupled to the connection member described above. An RF signal generated in the IC 1300*a* included in the IC package may be transferred to the antenna package through the at least one conductive layer 1310*a* and transmitted in a direction toward an upper surface of the antenna module, and an RF signal received by the antenna package may be transferred to the IC 1300*a* through the at least one conductive layer 1310*a*.

The IC package may further include a connection pad 1330*a* disposed on an upper surface and/or a lower surface of the IC 1300*a*. The connection pad 1330*a* disposed on the upper surface of the IC 1300*a* may be electrically connected to the at least one conductive layer 1310*a* and the connection pad 1330*a* disposed on the lower surface of the IC 1300*a* may be connected to the support member 1355*a* or a core plating member 1365*a* through a lower conductive layer 1320*a*. The core plating member 1365*a* may provide a grounding region to the IC 1300*a*.

The support member 1355*a* may include a core dielectric layer 1356*a* in contact with the connection member, a core conductive layer 1359*a* disposed on an upper surface and/or a lower surface of the core dielectric layer 1356*a*, and at least one core via 1360*a* penetrating through the core dielectric layer 1356*a*, electrically connecting the core conductive layer 1359*a*, and electrically connected to the connection pad 1330*a*. The at least one core via 1360*a* may be electrically connected to an electrical connection structure 1340*a* such as a solder ball, a pin, or a land.

Accordingly, the support member 1355*a* may receive a base signal or power from the lower surface thereof and transfer the base signal and/or power to the IC 1300*a* through the at least one conductive layer 1310*a* of the connection member.

The IC 1300*a* may generate an RF signal of a millimeter wave (mmWave) band using the base signal and/or power. For example, the IC 1300*a* may receive a base signal of a low frequency and perform frequency conversion, amplification, filtering, and phase control on the base signal, and power generation. The IC 1300*a* may be formed of a compound semiconductor (e.g., GaAs) or a silicon semiconductor in consideration of high frequency characteristics.

The IC package may further include a passive component 1350*a* electrically connected to a corresponding wiring of at least one conductive layer 1310*a*. The passive component 1350*a* may be disposed in an accommodation space 1306*a* provided by the support member 1355*a*.

The IC package may include core plating members 1365*a* and 1370*a* disposed on a side surface of the support member 1355*a*. The core plating members 1365*a* and 1370*a* may provide a ground region to the IC 1300*a* and may dissipate heat from the IC 1300*a* to the outside or cancel noise with respect to the IC 1300*a*.

The IC package and the connection member may be independently manufactured and coupled to each other or may be manufactured together according to design. That is, a separate process of coupling packages may be omitted.

The IC package may be coupled to the connection member through an electrical connection structure 1290*a* and a passivation layer 1285*a*, but the electrical connection structure 1290*a* and the passivation layer 1285*a* may be omitted according to designs.

Figure 13A:
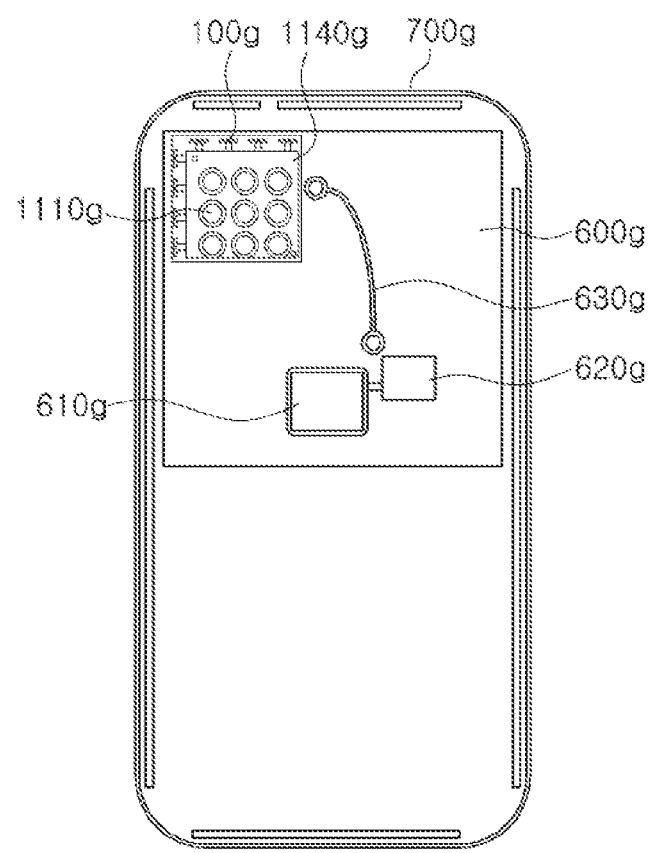
FIGS. 13A and 13B are plan views illustrating an arrangement of antenna modules in an electronic device, according to an embodiments.
Figure 13B:
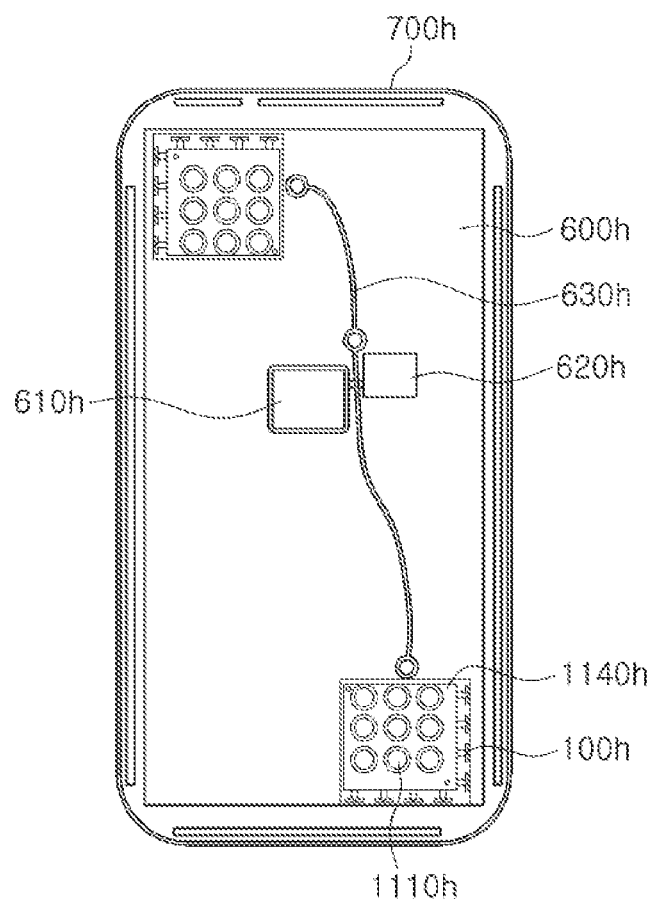

FIGS. 13A and 13B are plan views illustrating an arrangement of antenna modules in electronic devices 700*g* and 700*h*, respectively, according to embodiments.

Referring to FIG. 13A, an antenna module including an antenna apparatus 100*g*, a patch antenna pattern 1110*g*, and a dielectric layer 1140*g* may be mounted adjacent to a side boundary of the electronic device 700*g* on a set board 600*g* of the electronic device 700*g*.

The electronic device 700*g* may be a smartphone, a personal digital assistant, a digital video camera, a digital still camera, a network system, a computer, a monitor, a tablet, a laptop, a netbook, a television, a video game, a smart watch, or an automotive system, but is not limited to the foregoing examples.

A communications module 610*g* and a baseband circuit 620*g* may be further disposed on the set board 600*g*. The antenna module may be electrically coupled to the communications module 610*g* and/or the baseband circuit 620*g* via a coaxial cable 630*g*.

The communications module 610*g* may include at least some of a memory chip such as a volatile memory (e.g., DRAM), a non-volatile memory (e.g., ROM), a flash memory, etc., to perform digital signal processing; an application processor chip, such as a central processor (e.g., CPU), a graphics processor (e.g., GPU), a digital signal processor, an encryption processor, a microprocessor, or a micro-controller; and a logic chip such as an analog-to-digital converter (ADC), or an application-specific IC (ASIC).

The baseband circuit 620*g* may perform analog-to-digital conversion and amplification, filtering, and frequency conversion on an analog signal to generate a base signal. The base signal input/output from the baseband circuit 620*g* may be transferred to the antenna module via a cable.

For example, the base signal may be transferred to the IC through an electrical connection structure, a core via, and a wiring. The IC may convert the base signal into an RF signal of a millimeter wave (mmWave) band.

Referring to FIG. 13B, antenna modules each including an antenna apparatus 100*h*, a patch antenna pattern 1110*h* and a dielectric layer 1140*h* are mounted adjacent to one boundary and the other boundary of an electronic device 700*h* on a set board 600*h* of the electronic device 700*h*, and a communications module 610*h* and a baseband circuit 620*h* may be further disposed on the set board 600*h*. The antenna modules may be electrically connected to the communications module 610*h* and/or the baseband circuit 620*h* via a coaxial cable 630*h*.

The conductive layer, the ground layer, the feed line, the feeding via, the antenna pattern, the patch antenna pattern, the shielding via, the director pattern, the electrical connection structure, the plating member, and the core via described in this disclosure may include a metal (e.g., a conductive material such as copper (Cu), aluminum (Al), silver (Ag), tin (Sn), gold (Au), nickel (Ni), lead (Pb), titanium (Ti), or an alloy thereof) and may be formed through a plating method such as chemical vapor deposition (CVD), physical vapor deposition (PVD), sputtering, subtractive, additive, semi-additive process (SAP), a modified semi-additive process (MSAP), and the like, but is not limited to the foregoing examples.

The dielectric layer and/or the insulating layer described in this disclosure may be formed of a thermosetting resin such as FR4, liquid crystal polymer (LCP), low temperature co-fired ceramic (LTCC), a resin such as a thermoplastic resin such as an epoxy resin, a thermoplastic resin such as polyimide, a resin obtained by impregnating these resins in a core of glass fiber, glass cloth, glass fabric, and the like, together with an inorganic filler, prepreg, Ajinomoto build-up film (ABF), FR-4, bismaleimide triazine (BT), photo imageable dielectric (PID) resin, general copper clad laminate (CCL), or glass or ceramic-based insulator, and the like. The insulating layer may fill at least a portion of a position where a conductive layer, a ground layer, a feed line, a feeding via, an antenna pattern, a patch antenna pattern, a shield via, a director pattern, an electrical connection structure, a plating member, or a core via is not disposed in the antenna apparatus and the antenna module disclosed in this disclosure.

The RF signals described in this disclosure may have a form such as Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G and a following one in accordance with certain designated wireless and wired protocols, but is not limited to such examples.

As set forth above, the antenna module and/or antenna apparatus according to embodiments disclosed herein may have a structure advantageous for miniaturization, while improving antenna performance (e.g., transmission/reception ratio, gain, bandwidth, directivity, etc.).

The antenna module and/or the antenna apparatus according to an embodiment may maintain antenna performance, while having a reduced size by arranging the antenna pattern in a more compressed manner, improve the degree of freedom of a reflector of the antenna pattern to have more precisely adjusted antenna performance, and improve isolation between antenna apparatuses.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna apparatus, comprising:
a first ground layer, wherein a front boundary of the first ground layer has first and second recessed regions;
an antenna pattern having a form of a dipole and disposed in front of the first ground layer;
a feed line electrically connected to the antenna pattern and backwardly extended from the antenna pattern;
a second ground layer disposed to overlap the first and second recessed regions and at least a portion of the first ground layer in a vertical direction; and
second shielding vias connected to the second ground layer and arranged along at least a portion of a front boundary of the second ground layer.

2. The antenna apparatus of claim 1, further comprising:
first shielding vias connected to the first ground layer and arranged along at least a portion of boundaries of the first and second recessed regions.

3. The antenna apparatus of claim 1, wherein the dipole has first and second poles,
wherein a length of the first pole is longer than a width of the first recessed region, and
wherein a length of the second pole is longer than a width of the second recessed region.

4. The antenna apparatus of claim 3, wherein the first ground layer comprises a protruding region disposed between the first and second recessed regions, and
wherein a protruding length of the protruding region is shorter than a recessing length of each of the first and second recessed regions.

5. The antenna apparatus of claim 4, wherein a center of the protruding region is disposed in back of a space between the first and second poles.

6. The antenna apparatus of claim 5, further comprising:
feed vias vertically connected to the first and second poles.

7. The antenna apparatus of claim 1, further comprising:
a wiring electrically connected to the feed line and disposed to overlap the second ground layer in a vertical direction,
wherein a width of the feed line is greater than a width of the wiring.

8. The antenna apparatus of claim 7, wherein the feed line is configured as first and second feed lines spaced apart from each other, and
wherein the wiring is configured as wirings spaced apart from each other.

9. The antenna apparatus of claim 1, wherein the feed line is configured as first and second feed lines spaced apart from each other,
wherein the first feed line is disposed to be closer to the first recessed region than the second recessed region, and
wherein the second feed line is disposed to be closer to the second recessed region than the first recessed region.

10. An antenna apparatus, comprising:
a first ground layer, wherein a front boundary of the first ground layer has first and second recessed regions;
a second ground layer disposed to overlap the first and second recessed regions and at least a portion of the first ground layer in a vertical direction
an antenna pattern disposed in front of the first ground layer;
first and second feed lines spaced apart from each other, electrically connected to the antenna pattern and backwardly extended from the antenna pattern; and wirings electrically connected to the first and second feed lines and disposed to overlap the second ground layer in the vertical direction, wherein a front boundary of the first ground layer has a first recessed region disposed to be closer to the first feed line than the second feed line, and a second recessed region disposed to be closer to the second feed line than the first feed line, and wherein a width of each of the first and second feed lines is greater than a width of each of the wirings.

11. The antenna apparatus of claim 10, further comprising:

second shielding vias connected to the second ground layer and arranged along at least a portion of a front boundary of the second ground layer.

12. The antenna apparatus of claim 11, further comprising:

first shielding vias connected to the first ground layer and arranged along at least a portion of boundaries of the first and second recessed regions.

13. The antenna apparatus of claim 10, wherein the first ground layer comprises a protruding region disposed between the first and second recessed regions, and wherein a protruding length of the protruding region is different from a recessing length of each of the first and second recessed regions.

14. The antenna apparatus of claim 13, wherein the protruding length of the protruding region is shorter than the recessing length of each of the first and second recessed regions.

15. An antenna apparatus, comprising:

a first ground layer;

an antenna pattern disposed in front of the first ground layer;

a feed line electrically connected to the antenna pattern and backwardly extended from the antenna pattern; and first shielding vias connected to the first ground layer, wherein a front boundary of the first ground layer has first and second recessed regions, wherein the first ground layer comprises a protruding region disposed between the first and second recessed regions, wherein a protruding length of the protruding region is different from a recessing length of each of the first and second recessed regions, and wherein the first shielding vias are arranged along at least a portion of boundaries of the first and second recessed regions.

16. The antenna apparatus of claim 15, further comprising:

a second ground layer disposed to overlap the first and second recessed regions and at least a portion of the protruding region of the first ground layer in a vertical direction, wherein a front boundary of the second ground layer has a form of a straight line.

* * * * *